US009285525B2

(12) United States Patent
Kinohira et al.

(10) Patent No.: US 9,285,525 B2
(45) Date of Patent: *Mar. 15, 2016

(54) ORGANIC EL DISPLAY DEVICE

(71) Applicant: ZEON CORPORATION, Tokyo (JP)

(72) Inventors: Tomokazu Kinohira, Tokyo (JP); Kohei Fujii, Tokyo (JP); Takashi Morita, Tokyo (JP); Shunsuke Yamanaka, Tokyo (JP); Taku Hatano, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/689,837

(22) Filed: Apr. 17, 2015

(65) Prior Publication Data

US 2015/0219816 A1 Aug. 6, 2015

Related U.S. Application Data

(63) Continuation of application No. 14/385,315, filed as application No. PCT/JP2013/056336 on Mar. 7, 2013, now Pat. No. 9,048,457.

(30) Foreign Application Priority Data

Mar. 15, 2012 (JP) ................. 2012-059423

(51) Int. Cl.
*H01L 29/08* (2006.01)
*G02B 5/30* (2006.01)
(Continued)

(52) U.S. Cl.
CPC ............ *G02B 5/3083* (2013.01); *G02B 5/3025* (2013.01); *H01L 27/3232* (2013.01); *H01L 51/5281* (2013.01); *H01L 51/5293* (2013.01)

(58) Field of Classification Search
CPC ..... H01L 25/048; H01L 27/28; H01L 27/286; H01L 27/288; H01L 27/32
See application file for complete search history.

(56) References Cited

U.S. PATENT DOCUMENTS

| 4,680,353 A | 7/1987 | Ishihara et al. |
| 9,048,457 B2 * | 6/2015 | Kinohira et al. |
| 2009/0167999 A1 | 7/2009 | Ohmori et al. |

FOREIGN PATENT DOCUMENTS

| CN | 101512402 A | 8/2009 |
| JP | 62187708 A | 8/1987 |

(Continued)

OTHER PUBLICATIONS

Jun. 11, 2013 International Search Report issued in International Application No. PCT/JP2013/056336.

(Continued)

*Primary Examiner* — Elias M Ullah
(74) *Attorney, Agent, or Firm* — Oliff PLC

(57) ABSTRACT

An organic EL display device including a substrate, a transparent electrode, a luminescent layer, and a metal electrode layer in this order from a light emission side, a circularly polarizing plate disposed on the light emission side of the substrate, the circularly polarizing plate including a polarizing film and phase difference films that stacked on each other. The phase difference film includes a resin composition (A) containing polystyrene-based polymer having a syndiotactic structure and polyarylene ether, a ratio of the polystyrene-based polymer having the syndiotactic structure with respect to the polyarylene ether in the resin composition (A) is 65:35 to 55:45, being a weight ratio of (the polystyrene-based polymer having the syndiotactic structure) with respect to (the polyarylene ether), the phase difference film satisfies a relation $Re_{450} < Re_{550} < Re_{650}$, and an Nz coefficient of the phase difference film at a wavelength of 550 nm is −0.25 to −0.05.

18 Claims, 12 Drawing Sheets

Equal color difference contour

(51) Int. Cl.
*H01L 51/52* (2006.01)
*H01L 27/32* (2006.01)

(56) References Cited

FOREIGN PATENT DOCUMENTS

| JP | 01146912 A | 6/1989 |
|---|---|---|
| JP | 06059121 A | 3/1994 |
| JP | 2001042121 A | 2/2001 |
| JP | 2001249222 A | 9/2001 |
| JP | 2008146003 A | 6/2008 |
| JP | 2010078905 A | 4/2010 |
| JP | 2011118137 A | 6/2011 |
| JP | 2012226996 A | 11/2012 |
| WO | 2008032615 A1 | 3/2008 |
| WO | 2010074166 A1 | 7/2010 |

OTHER PUBLICATIONS

Sep. 16, 2014 International Preliminary Report on Patentability issued in International Patent Application No. PCT/JP2013/056336.
Dec. 24, 2015 Office Action issued in Chinese Patent Application No. 201380013441.9.

* cited by examiner

Equal color difference contour

Isoluminance contour [nit]

Equal color difference contour

Equal color difference contour

Isoluminance contour [nit]

Equal color difference contour

Equal color difference contour

Equal color difference contour

ORGANIC EL DISPLAY DEVICE

This is a Continuation application of application Ser. No. 14/385,315 filed Sep. 15, 2014 which is a National Phase of PCT/JP2013/056336 filed on Mar. 7, 2013 which claims priority from Japanese Application No. 2012-059423 filed Mar. 15, 2012. The disclosures of the prior applications are hereby incorporated by reference herein in their entirety.

FIELD

The present invention relates to an organic EL display device. More specifically, the present invention relates to an organic EL display device that includes a circularly polarizing plate formed by stacking a polarizing film and a phase difference film and has good viewing angle characteristics and a high anti-reflection effect.

BACKGROUND

A display device using an organic EL luminescent element has a metal electrode disposed on the rear side of a luminescent layer with respect to an observer. This display device has a problem in that, when external light is present, its display quality is significantly impaired by light reflected at the metal electrode or by reflection of a scenery on the observer side. There is known a technique wherein, for the purpose of preventing reflection from the metal, a circularly polarizing plate serving as an anti-reflection film is used on a front substrate of the luminescent element. The circularly polarizing plate includes a polarizing plate and a phase difference film serving as a ¼ wave plate. There is known a technique wherein an oriented polymer film obtained by stretching a polymer film is used as the phase difference film.

When such a prior-art phase difference film is used as a circularly polarizing film, a favorable anti-reflection effect is obtained only at a certain wavelength at which phase difference is ¼ of the wavelength. However, a favorable anti-reflection effect cannot be obtained over a wide wavelength range such as the visible range of 400 nm to 700 nm. As a result, there occurs a problem of coloration of the reflected light.

Patent Literature 1 discloses that, when an anti-reflection film in which phase differences at wavelengths of 450 nm and 550 nm satisfy the relation |R(450)|<|R(550)| (where |R(450)| and |R(550)| represent the absolute values (nm) of in-plane phase differences at wavelengths of 450 nm and 550 nm) is used as a phase difference film, light reflection from a highly reflective reflection surface, such as a metal electrode incorporated in an electroluminescent display element, can be effectively prevented over a wide wavelength range.

CITATION LIST

Patent Literature

Patent Literature 1: Japanese Patent Application Laid-Open No. 2001-249222 A

SUMMARY

Technical Problem

However, when the anti-reflection film disclosed in Patent Literature 1 is used for an organic EL element, viewing angle characteristics may be insufficient, and contrast of the screen when viewed in an oblique direction may be insufficient. Further, in some cases, the flexibility of the film is insufficient, and the film is ruptured in its production process.

The present invention has been created in view of the foregoing problems, and it is an object to provide an organic EL display device having good viewing angle characteristics and a high anti-reflection effect.

Solution to Problem

The present inventor has conducted extensive studies to solve the aforementioned problems and found out that the aforementioned problems can be solved by employing a circularly polarizing plate produced by stacking a polarizing film and a phase difference film, wherein the phase difference film is a film that is formed from a resin composition (A) containing a polystyrene-based polymer having a syndiotactic structure and polyarylene ether and has in-plane direction retardations within a specific range and an Nz coefficient at a wavelength of 550 nm within a specific range. Thus, the present invention has been completed.

The present invention provides the following (1) to (12).
(1) An organic EL display device comprising a substrate, a transparent electrode, a luminescent layer, and a metal electrode layer in this order from a light emission side,
the organic EL display device further comprising a circularly polarizing plate disposed on the light emission side of the substrate, the circularly polarizing plate including a polarizing film and a phase difference film that are stacked on each other, wherein
the phase difference film includes a layer formed of a resin composition (A) containing a polystyrene-based polymer having a syndiotactic structure and polyarylene ether,
a ratio of the polystyrene-based polymer having the syndiotactic structure with respect to the polyarylene ether in the resin composition (A) is 65:35 to 55:45, the ratio being a weight ratio of (the polystyrene-based polymer having the syndiotactic structure) with respect to (the polyarylene ether),
the phase difference film satisfies a relation $Re_{450} < Re_{550} < Re_{650}$, and
an Nz coefficient of the phase difference film at a wavelength of 550 nm is −0.25 to −0.05
(wherein $Re_{450}$, $Re_{550}$, and $Re_{650}$ are in-plane direction retardations of the phase difference film at measurement wavelengths of 450 nm, 550 nm, and 650 nm, respectively,
the Nz coefficient represents $(n_x - n_z)/(n_x - n_y)$,
$n_x$ represents a refractive index in a direction of an in-plane slow axis of the phase difference film,
$n_y$ represents a refractive index in a direction of an in-plane fast axis of the phase difference film, and
$n_z$ represents a refractive index in a thickness direction of the phase difference film).
(2) The organic EL display device according to (1), wherein $Re_{450}/Re_{550}$ in the phase difference film is 0.80 or more and 0.90 or less.
(3) The organic EL display device according to (1) or (2), wherein a birefringence Δn (Δn=$n_x - n_y$) of the phase difference film at a wavelength of 550 nm is 0.0020 or more and 0.0050 or less.
(4) The organic EL display device according to any one of (1) to (3), wherein the phase difference film has a thickness of 80 μm or less.
(5) The organic EL display device according to any one of (1) to (4), wherein the polyarylene ether contains a polymer including a phenylene ether unit.

(6) The organic EL display device according to any one of (1) to (5), wherein the in-plane direction retardation $Re_{550}$ of the phase difference film at a measurement wavelength of 550 nm is 110 nm to 150 nm.

(7) The organic EL display device according to any one of (1) to (6), wherein the phase difference film is prepared by subjecting a long-length pre-stretch film formed of the resin composition (A) to stretching in a direction within a range of 40° or more and 50° or less with respect to a lengthwise direction of the long-length pre-stretch film.

(8) The organic EL display device according to any one of (1) to (6), wherein the phase difference film is prepared by subjecting a long-length pre-stretch film layered body to stretching in a direction within a range of 40° or more and 50° or less with respect to a lengthwise direction of the long-length pre-stretch film layered body, the pre-stretch film layered body including a P1 layer formed of the resin composition (A) and a P2 layer provided in contact with the P1 layer and formed of a thermoplastic resin (B).

(9) The organic EL display device according to any one of (1) to (6), wherein the phase difference film is prepared by: subjecting a long-length pre-stretch film layered body to stretching in a direction within a range of 40° or more and 50° or less with respect to a lengthwise direction of the long-length pre-stretch film layered body, the pre-stretch film layered body including a P1 layer formed of the resin composition (A) and a P2 layer provided in contact with the P1 layer and formed of a thermoplastic resin (B), whereby a phase difference film layered body including a p1 layer formed by stretching the P1 layer and a p2 layer formed by stretching the P2 layer is obtained; and then removing the p2 layer.

(10) The organic EL display device according to (8) or (9), wherein the thermoplastic resin (B) is at least one selected from acrylic resins, resins containing alicyclic structure-containing polymers, and polycarbonate resins.

(11) The organic EL display device according to any one of (8) to (10), wherein the long-length pre-stretch film layered body is obtained by co-extrusion or co-flow casting of the resin composition (A) and the thermoplastic resin (B).

(12) The organic EL display device according to any one of (7) to (11), wherein the stretching is performed at a temperature equal to or higher than $(Tg-15)° C.$ and equal to or lower than $(Tg+1)° C.$, wherein (Tg) is the glass transition temperature of the resin composition (A).

Advantageous Effects of Invention

According to the present invention, an organic EL display device having good viewing angle characteristics and a high anti-reflection effect can be obtained.

DESCRIPTION OF EMBODIMENTS

Figure 1:
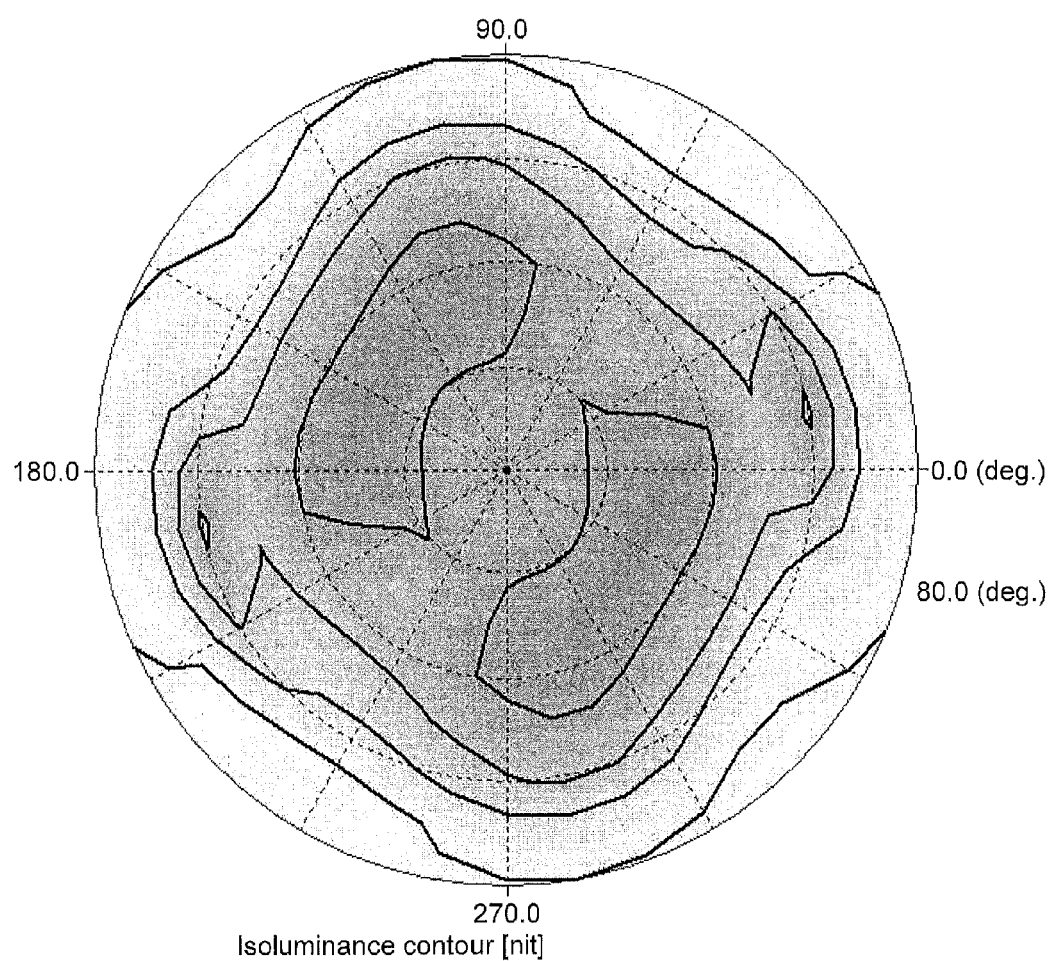
FIG. 1 is a contrast map of an organic EL display device obtained in Example 1.

The present invention will be described in detail by way of embodiments and exemplifications. However, the present invention is not limited to the following embodiments and exemplifications and may be implemented with any modifications without departing from the scope of the claims of the present invention and equivalents thereto.

In the following description, "(meth)acrylic" is meant to include both acrylic and methacrylic.

The organic EL display device of the present invention includes a substrate, a transparent electrode, a luminescent layer, and a metal electrode layer in this order from a light-emitting side, and further includes a circularly polarizing plate formed by stacking a polarizing film and a phase difference film on the light-emitting side of the substrate.

(Resin Composition (A))

The phase difference film includes a layer formed of a resin composition (A) containing a polystyrene-based polymer having a syndiotactic structure and polyarylene ether. The polystyrene-based polymer having a syndiotactic structure means that the stereochemical structure of the polystyrene-based polymer is a syndiotactic structure. The syndiotactic structure is a stereo structure in which, in a Fischer projection formula, phenyl groups, which are side chains, are located alternately on opposite sides with respect to the main chain formed from carbon-carbon bonds.

The tacticity (stereoregularity) of the polystyrene-based polymer may be quantified by a nuclear magnetic resonance method using a carbon isotope ($^{13}C$-NMR method). The tacticity measured by the $^{13}C$-NMR method may be represented by the existence ratio of constituent units that are successively present in plurality. Generally, e.g., two successive structural units constitute a dyad, three successive structural units constitute a triad, and five successive structural units constitute a pentad. In this case, the polystyrene-based polymer having a syndiotactic structure has a syndiotacticity of usually 75% or more and preferably 85% or more based on racemic diads or a syndiotacticity of usually 30% or more and preferably 50% or more based on racemic pentads.

The polystyrene-based polymer having a syndiotactic structure includes a homopolymer of styrene or a styrene derivative (when appropriate, styrene and styrene derivatives may be collectively referred to hereinbelow as "styrene compounds") or a copolymer of any of styrene compounds with an optional monomer. As the polymer, one type thereof may be solely used, or two or more types thereof may be used in combination. Examples of the styrene derivatives may include a styrene derivative having a substituent on the benzene ring or at an α position of styrene. Examples of the styrene compounds may include: styrene; alkyl styrenes such as methylstyrene and 2,4-dimethylstyrene; halogenated styrenes such as chlorostyrene; halogen-substituted alkyl styrenes such as chloromethylstyrene; and alkoxystyrenes such as methoxystyrene. As the styrene or styrene derivative, one type thereof may be solely used, or two or more types thereof may be used in combination at any ratio.

Preferred examples of the optional monomer for use in the polystyrene-based polymer having the syndiotactic structure may include acrylonitrile, maleic anhydride, methyl methacrylate, and butadiene. In the present invention, preferable ones of these are homopolymers of styrene or styrene derivatives from the viewpoint of high degree of phase difference expression and compatibility with the polyarylene ether. Syndiotactic polystyrene, which is a homopolymer of styrene, is particularly preferable. When the optional monomer is copolymerized, the polymerization ratio of the optional monomer is preferably less than 5% by weight from the viewpoint of compatibility with the polyarylene ether resin.

The weight average molecular weight of the polystyrene-based polymer having the syndiotactic structure is usually 130,000 or more, preferably 140,000 or more, and more preferably 150,000 or more and is usually 300,000 or less, preferably 270,000 or less, and more preferably 250,000 or less. When the weight average molecular weight is in such a range, the glass transition temperature of the polystyrene-based polymer can be raised, and the heat resistance of the phase difference film can thereby be stably improved.

The glass transition temperature of the polystyrene-based polymer having the syndiotactic structure is usually 85° C. or higher, preferably 90° C. or higher, and more preferably 95° C. or higher. By raising the glass transition temperature of the polystyrene-based polymer as described above, the glass transition temperature of the resin composition (A) can be effectively raised, and therefore the heat resistance of the phase difference film can be stably improved. From the viewpoint of stable and easy production of the phase difference film, the glass transition temperature of the polystyrene-based polymer having the syndiotactic structure is usually 160° C. or lower, preferably 155° C. or lower, and more preferably 150° C. or lower.

The polystyrene-based polymer having the syndiotactic structure may be produced, e.g., by polymerization of any of the styrene compounds using, as catalysts, a titanium compound and a condensation product of water and trialkylaluminium in an inert hydrocarbon solvent or in the absence of a solvent (see Japanese Patent Application Laid-Open No. Sho. 62-187708 A). Poly(halogenated alkylstyrene) may be produced, e.g., by a method described in Japanese Patent Application Laid-Open No. Hei. 1-146912 A.

The polyarylene ether is a polymer including a repeating unit having an arylene ether skeleton in its main chain. Particularly, a polymer including a phenylene ether unit represented by the following formula (I) is preferable as the polyarylene ether.

The polyarylene ether is a polymer including a repeating unit having an arylene ether skeleton in its main chain. Particularly, a polymer including a phenylene ether unit represented by the following formula (I) is preferable as the polyarylene ether.

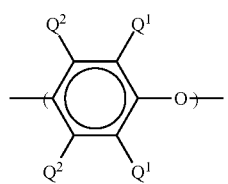

(I)

In the formula (I), each $Q^1$ independently represents a halogen atom, a lower alkyl group (for example, an alkyl group having 7 or less carbon atoms), a phenyl group, a haloalkyl group, an aminoalkyl group, a hydrocarbon oxy group, or a halohydrocarbon oxy group (with a proviso that a halogen atom and an oxygen atom are separated by at least two carbon atoms). Of these, as $Q^1$, an alkyl group and a phenyl group are preferable, and an alkyl group having 1 or more and 4 or less carbon atoms is particularly preferable.

In the formula (I), each $Q^2$ independently represents a hydrogen atom, a halogen atom, a lower alkyl group (for example, an alkyl group having 7 or less carbon atoms), a phenyl group, a haloalkyl group, a hydrocarbon oxy group, or a halohydrocarbon oxy group (with a proviso that a halogen atom and an oxygen atom are separated by at least two carbon atoms). Of these, a hydrogen atom is preferable as $Q^2$.

The polyarylene ether may be a homopolymer having one type of structural unit or a copolymer having two or more types of structural units.

When the polymer containing the structural unit represented by the formula (I) is a homopolymer, preferred examples of the homopolymer may include a homopolymer having a 2,6-dimethyl-1,4-phenylene ether unit (a repeating unit represented by "—$(C_6H_2(CH_3)_2$—O)—").

When the polymer containing the structural unit represented by the formula (I) is a copolymer, preferred examples of the copolymer may include a random copolymer having a combination of a 2,6-dimethyl-1,4-phenylene ether unit and a 2,3,6-trimethyl-1,4-phenylene ether unit (i.e., a repeating unit represented by "—$(C_6H(CH_3)_3$—O—)—").

The polyarylene ether may contain a repeating unit other than the arylene ether unit. In this case, the polyarylene ether is a copolymer having the arylene ether unit and a structural unit other than the arylene ether unit. However, it is preferable that the ratio of the structural unit other than the arylene ether unit in the polyarylene ether is small to the extent that the effects of the present invention are not significantly impaired. The ratio is usually 50% by weight or less, preferably 30% by weight or less, more preferably 20% by weight or less, and particularly preferably 0% by weight.

As the polyarylene ether, one type thereof may be solely used, or a two or more types thereof may be used in combination at any ratio.

The ratio of the polystyrene-based polymer having a syndiotactic structure with respect to the polyarylene ether in the resin composition (A), i.e., the weight ratio of (the polystyrene-based polymer having the syndiotactic structure):(polyarylene ether), is 65:35 to 55:45, preferably 63.5:36.5 to 56.5:43.5, and more preferably 62:38 to 58:42. When the composition of the resin is within this range, a phase difference film in which $Re_{450}/Re_{550}$ and $Re_{650}/Re_{550}$ are within desired ranges, which will be described later, can be easily obtained when the phase difference film is formed by stretching.

The resin composition (A) may contain a component other than the polystyrene-based polymer having the syndiotactic structure and the polyarylene ether, so long as the effects of the invention are not significantly impaired.

For example, the resin composition (A) may contain a polymer other than the polystyrene-based polymer having the syndiotactic structure and the polyarylene ether. The amount of the polymer other than the polystyrene-based polymer having the syndiotactic structure and the polyarylene ether is preferably 15 parts by weight or less, more preferably 10 parts by weight or less, still more preferably 5 parts by weight or less, and particularly preferably 0 parts by weight based on 100 parts by weight of the total amount of the polystyrene-based polymer having the syndiotactic structure and the polyarylene ether.

The resin composition (A) may also contain, e.g., an additive. Examples of the additive may include: lamellar crystal compounds; fine particles; stabilizers such as an antioxidant, a thermostabilizer, a light stabilizer, a weathering stabilizer, an ultraviolet absorber, and a near infrared absorber; a plasticizer; coloring agents such as dyes and a pigment; and an antistatic agent. As the additive, one type thereof may be used, or two or more types thereof may be used in combination at any ratio. The amount of the additive may be appropriately set within the range in which the effects of the present invention are not significantly impaired. For example, the amount may be set within the range in which the total light transmittance of the phase difference film can be maintained at 85% or higher.

The glass transition temperature of the resin composition (A) is usually 115° C. or higher, preferably 120° C. or higher, and more preferably 125° C. or higher. Higher glass transition temperature of the resin composition (A) brings about better heat resistance of the phase difference film. However, excessively high glass transition temperature may hinder production of the phase difference film. Therefore, the glass transition temperature of the resin composition (A) is usually 200° C. or lower.

(Phase Difference Film)

The phase difference film for use in the present invention satisfies the relation $Re_{450} < Re_{550} < Re_{650}$. $Re_{450}$, $Re_{550}$, and $Re_{650}$ represent retardations in the in-plane direction of the phase difference film at measurement wavelengths of 450 nm, 550 nm, and 650 nm, respectively. This usually means that the phase difference film has inverse wavelength distribution property. When the phase difference film having such inverse wavelength distribution property is applied to an organic EL display device, changes in color tone at different observation angles can be reduced, and effects such as correction of retardation can be obtained uniformly over a wide wavelength range.

Regarding the relationship of these parameters, $Re_{450}/Re_{550}$ is preferably 0.95 or less, more preferably 0.90 or less, and still more preferably 0.88 or less and is preferably 0.80 or more. $Re_{650}/Re_{550}$ is preferably 1.05 or more and more preferably 1.10 or more and is preferably 1.20 or less. When $Re_{450}$, $Re_{550}$, and $Re_{650}$ satisfy these relations, the effects such as correction of retardation can be obtained more uniformly over a wide wavelength range.

Preferably, in the phase difference film according to the present invention, the in-plane direction retardation $Re_{550}$ at a measurement wavelength of 550 nm is 110 nm or more and 150 nm or less. By having such retardation, the phase difference film can function as a ¼ wave plate, and a stacked product of the phase difference film and a polarizing film can act as a circularly polarizing plate.

The in-plane direction retardation at each measurement wavelength ($Re_{450}$, $Re_{550}$, and $Re_{650}$) is a value represented by $|nx-ny| \times d$ (wherein nx represents a refractive index in a direction of a slow axis in the plane of the phase difference film, ny represents a refractive index in a direction of a fast axis in the plane of the phase difference film, and d represents a film thickness).

The phase difference film for use in the present invention has a birefringence $\Delta n$ at a wavelength of 550 nm of preferably 0.0020 or more and more preferably 0.0030 or more. $\Delta n$ is preferably 0.0050 or less and more preferably 0.0045 or less. Herein $\Delta n = nx - ny$, and nx and ny are the same as those described above. When $\Delta n$ is within the aforementioned range, the phase difference film can have reduced thickness, and changes in the optical properties of the phase difference film over the lapse of time can be suppressed.

The phase difference film for use in the present invention has an Nz coefficient at a wavelength of 550 nm of −0.25 to −0.05 and preferably −0.18 to −0.10. The Nz coefficient is a value represented by $(nx-nz)/(nx-ny)$ (where nx and ny are the same as those described above, and nz represents a refractive index in the thickness direction of the phase difference film). A phase difference film having an Nz coefficient within the aforementioned range can be easily produced by diagonal stretching, and can realize good viewing angle characteristics of the organic EL display device of the present invention.

Since the phase difference film is used as an optical film, the total light transmittance of the phase difference film is preferably 85% or more and more preferably 92% or more. The total light transmittance is an average value calculated from values measured at five points using a "turbidimeter NDH-300A" manufactured by NIPPON DENSHOKU INDUSTRIES Co., Ltd. in accordance with JIS K7361-1997.

The haze of the phase difference film is preferably 1% or less, more preferably 0.8% or less, and particularly preferably 0.5% or less. When the haze value is small, the clarity of an image displayed on a display device in which the phase difference film is installed can be increased. The haze is an average value calculated from values measured at five points using a "turbidimeter NDH-300A" manufactured by NIPPON DENSHOKU INDUSTRIES Co., Ltd. in accordance with JIS K7361-1997.

The phase difference film for use in the present invention has a $\Delta YI$ of preferably 5 or less and more preferably 3 or less. When the $\Delta YI$ is within the aforementioned range, good visibility without coloring can be achieved. The $\Delta YI$ is determined as the arithmetic average of measurements repeated five times using a "spectral color-difference meter SE2000" manufactured by NIPPON DENSHOKU INDUSTRIES Co., Ltd. in accordance with ASTM E313.

The thickness of the phase difference film is usually 5 μm or more, preferably 8 μm or more, more preferably 10 μm or more, and particularly preferably 20 μm or more and is usually 500 μm or less, preferably 80 μm or less, and more preferably 50 μm or less.

(Additional Layer)

The phase difference film for use in the present invention may be a film including only a layer formed of the resin composition (A). Alternatively, the phase difference film for use in the present invention may optionally include an additional layer other than the layer formed of the resin composition (A), so long as the optical function of the phase difference film is not inhibited. The phase difference film prepared as a layered body including the layer formed of the resin composition (A) and the additional layer other than the layer formed of the resin composition (A) in this manner may be referred to hereinbelow as a "multi-layer phase difference film". For example, the multi-layer phase difference film may include a transparent resin layer for increasing the strength of the phase difference film. The material constituting the transparent resin layer may be any thermoplastic resin (B) that is capable of reinforcing the strength of the phase difference film. The thermoplastic resin (B) is more preferably one or more selected from acrylic resins, resins containing alicyclic structure-containing polymers, and polycarbonate resins and is particularly preferably an acrylic resin or a resin containing an alicyclic structure-containing polymer. From the viewpoint of facilitating co-stretching process with an unstretched film formed of the resin composition (A), the thermoplastic resin (B) is preferably a resin which does not express optical anisotropy under the stretching conditions which will be described later.

The acrylic resin constituting the thermoplastic resin (B) is a resin containing an acrylic polymer. The acrylic polymer means a polymer of (meth)acrylic acid or a derivative of (meth)acrylic acid. Examples of the acrylic polymer may include homopolymers and copolymers of acrylic acid, acrylic acid ester, acrylamide, acrylonitrile, methacrylic acid, methacrylic acid ester, etc. Since the acrylic resin is hard with high durability, the acrylic resin layer can appropriately protect the layer formed of the resin composition (A), so that the strength of the multi-layer phase difference film can be increased.

The acrylic polymer is preferably a polymer containing a structural unit formed by polymerization of a (meth)acrylic acid ester. Examples of the (meth)acrylic acid ester may include alkyl esters of (meth)acrylic acid. Particularly, a (meth)acrylic acid ester having a structure derived from (meth)acrylic acid and an alkanol or cycloalkanol having 1 to 15 carbon atoms is preferable, and a (meth)acrylic acid ester having a structure derived from (meth)acrylic acid and an alkanol having 1 to 8 carbon atoms is more preferable.

Specific examples of the acrylic acid ester may include methyl acrylate, ethyl acrylate, n-propyl acrylate, i-propyl acrylate, n-butyl acrylate, i-butyl acrylate, sec-butyl acrylate, t-butyl acrylate, n-hexyl acrylate, cyclohexyl acrylate, n-octyl acrylate, 2-ethylhexyl acrylate, n-decyl acrylate, and n-dodecyl acrylate.

Specific examples of the methacrylic acid ester may include methyl methacrylate, ethyl methacrylate, n-propyl methacrylate, i-propyl methacrylate, n-butyl methacrylate, i-butyl methacrylate, sec-butyl methacrylate, t-butyl methacrylate, n-hexyl methacrylate, n-octyl methacrylate, 2-ethylhexyl methacrylate, n-decyl methacrylate, and n-dodecyl methacrylate.

The aforementioned (meth)acrylic acid ester may have a substituent such as a hydroxyl group or a halogen atom within the range in which the effects of the present invention are not significantly impaired. Examples of the (meth)acrylic acid ester having such a substituent may include 2-hydroxyethyl acrylate, 2-hydroxypropyl acrylate, 4-hydroxybutyl acrylate, 2-hydroxyethyl methacrylate, 2-hydroxypropyl methacrylate, 4-hydroxybutyl methacrylate, 3-chloro-2-hydroxypropyl methacrylate, and glycidyl methacrylate. One type thereof may be solely used, or a two or more types thereof may be used in combination at any ratio.

The acrylic polymer may be a polymer of only (meth)acrylic acid or a derivative of (meth)acrylic acid or may be a copolymer of (meth)acrylic acid or a derivative of (meth)acrylic acid with a monomer copolymerizable therewith. Examples of the copolymerizable monomer may include $\alpha,\beta$-ethylenic unsaturated carboxylic acid ester monomers other than (meth)acrylic acid esters, $\alpha,\beta$-ethylenic unsaturated carboxylic acid monomers, alkenyl aromatic monomers, conjugated diene monomers, non-conjugated diene monomers, esters of carboxylic acids and unsaturated alcohols, and olefin monomers. One type thereof may be solely used, or a two or more types thereof may be used in combination at any ratio.

Further, as the acrylic polymer, one type thereof may be solely used, or a two or more types thereof may be used in combination at any ratio.

Among the aforementioned acrylic polymers, polymethacrylates are preferable, and polymethyl methacrylate is more preferable.

The acrylic resin may contain rubber particles. When the acrylic resin contains the rubber particles, the flexibility of the acrylic resin can be increased, and the shock resistance of the multi-layer phase difference film can thereby be improved. In addition, the rubber particles form irregularities on the surface of the acrylic resin layer, and the area of contact on the surface of the acrylic resin layer is reduced. Therefore, usually, slidability on the surface of the acrylic resin layer can be increased.

Examples of the rubber forming the rubber particles may include acrylic acid ester polymer rubbers, polymer rubbers composed mainly of butadiene, and ethylene-vinyl acetate copolymer rubbers. Examples of the acrylic acid ester polymer rubber may include rubbers containing butyl acrylate, 2-ethylhexyl acrylate, etc. as a main component of the monomer unit. Of these, acrylic acid ester polymer rubbers containing butyl acrylate as a main component and polymer rubbers containing butadiene as a main component are preferable.

The rubber particles may contain two or more types of rubbers. These rubbers may be uniformly mixed or may be layered. Examples of the rubber particles containing layered rubbers may include particles in which the layers form a core-shell structure, wherein: the core is formed from a rubber elastic component obtained by grafting an alkyl acrylate such as butyl acrylate and styrene; and a hard resin layer (shell) is formed from a copolymer of an alkyl acrylate with one or both of polymethyl methacrylate and methyl methacrylate.

The number average particle diameter of the rubber particles is preferably 0.05 μm or more and more preferably 0.1 μm or more and is preferably 0.3 μm or less and more preferably 0.25 μm or less. When the number average particle diameter is within the aforementioned range, appropriate irregularities can be formed on the surface of the acrylic resin layer to improve the slidability of the multi-layer phase difference film.

The amount of the rubber particles is preferably 5 parts by weight or more and preferably 50 parts by weight or less based on 100 parts by weight of the acrylic polymer. When the amount of the rubber particles is within the aforementioned range, the shock resistance of the multi-layer phase difference film can be increased to thereby improve its handleability.

The acrylic resin may contain a component other than the acrylic polymer and the rubber particles, so long as the effects of the invention are not significantly impaired. For example, the acrylic resin may contain a polymer other than the acrylic polymer. However, from the viewpoint of exerting the advantages of the present invention to a significant degree, it is preferable that the amount of the polymer other than the acrylic polymer and the rubber particles in the acrylic resin is small. For example, the specific amount of the polymer other than the acrylic polymer and the rubber particles is preferably 10 parts by weight or less, more preferably 5 parts by weight or less, and still more preferably 3 parts by weight or less based on 100 parts by weight of the acrylic polymer. Particularly preferably, the acrylic resin contains no polymer other than the acrylic polymer and the rubber particles.

From the viewpoint of exerting the advantages of the present invention to a significant degree, it is preferable that the amount of the polymer other than the acrylic polymer in the acrylic resin is small. For example, the specific amount of the polymer other than the acrylic polymer is preferably 10 parts by weight or less, more preferably 5 parts by weight or less, and still more preferably 3 parts by weight or less based on 100 parts by weight of the acrylic polymer. Particularly preferably, the acrylic resin contains no polymer other than the acrylic polymer.

The glass transition temperature of the acrylic resin is usually 80° C. or higher and preferably 90° C. or higher and is usually 120° C. or lower and preferably 110° C. or lower. When the glass transition temperature of the acrylic resin is equal to or higher than the lower limit in the aforementioned range, blocking of resin pellets during drying at high temperature can be suppressed, so that contamination of the resin pellets with water can be prevented. When the glass transition temperature of the acrylic resin is equal to or lower than the upper limit, the degree of orientation of the acrylic polymer during stretching can be reduced, so that inhibition of exertion of the optical function by the layer formed of the resin composition (A) can be suppressed.

The glass transition temperature of the acrylic resin is preferably equal to or lower than $Tg_A-10°$ C. and more preferably equal to or lower than $Tg_A-20°$ C., wherein $Tg_A$ is the glass transition temperature of the resin composition (A). When the glass transition temperature of the acrylic resin is equal to or lower than the upper limit in the aforementioned range, rupture of a P1 layer under the stretching temperature conditions which will be described later can be prevented, and a phase difference film having $\Delta n$, $Re_{550}$, and $Re_{450}/Re_{550}$ within desired ranges can be easily obtained.

The alicyclic structure-containing polymer constituting the thermoplastic resin (B) is a polymer having an alicyclic structure in the repeating unit of the polymer, and any of a polymer having an alicyclic structure in its main chain and a polymer having an alicyclic structure in a side chain may be used. As the alicyclic structure-containing polymer, one type thereof may be solely used, or a two or more types thereof may be used in combination at any ratio. Particularly, from the viewpoint of mechanical strength, heat resistance, etc., a polymer containing an alicyclic structure in its main chain is preferable.

Examples of the alicyclic structure may include saturated alicyclic hydrocarbon (cycloalkane) structures and unsaturated alicyclic hydrocarbon (cycloalkene or cycloalkyne) structures. Of these, the cycloalkane structures and cycloalkene structures are preferable from the viewpoint of mechanical strength, heat resistance, etc., and the cycloalkane structures are particularly preferable.

The number of carbon atoms constituting one alicyclic structure is preferably 4 or more and more preferably 5 or more and is preferably 30 or less, more preferably 20 or less, and particularly preferably 15 or less. The number of carbon atoms within the aforementioned range is preferable because the mechanical strength, heat resistance, and moldability into film are highly balanced.

The ratio of the repeating unit having the alicyclic structure in the alicyclic structure-containing polymer may be appropriately selected in accordance with the application purpose. The ratio is preferably 55% by weight or more, more preferably 70% by weight or more, and particularly preferably 90% by weight or more. It is preferable from the viewpoint of heat resistance that the ratio of the repeating unit having the alicyclic structure in the alicyclic structure-containing polymer is within the aforementioned range.

Examples of the alicyclic structure-containing polymer may include norbornene-based polymers, monocyclic olefin-based polymers, cyclic conjugated diene-based polymers, vinyl alicyclic hydrocarbon-based polymers, and hydrogenated products thereof. Of these, norbornene-based polymers are preferable because they have good moldability.

Examples of the norbornene-based polymers may include: a ring-opening polymer of a monomer having a norbornene structure, a ring-opening copolymer of a monomer having a norbornene structure with another optional monomer, and hydrogenated products thereof; and an addition polymer of a monomer having a norbornene structure, an addition copolymer of a monomer having a norbornene structure with another optional monomer, and hydrogenated products thereof. Of these, the hydrogenated products of the ring-opening (co) polymer of a monomer having a norbornene structure is particularly preferable from the viewpoint of moldability, heat resistance, low hygroscopicity, size stability, light weight, etc. The term "(co)polymer" refers to a polymer and a copolymer.

Examples of the monomer having a norbornene structure may include bicyclo[2.2.1]hept-2-ene (trivial name: norbornene), tricyclo[4.3.0.1$^{2,5}$]deca-3,7-diene (trivial name: dicyclopentadiene), 7,8-benzotricyclo[4.3.0.1$^{2,5}$]deca-3-ene (trivial name: methanotetrahydrofluorene), tetracyclo [4.4.0.1$^{2,5}$.1$^{7,10}$]dodeca-3-ene (trivial name: tetracyclododecene), and derivatives of these compounds (for example, compounds having substituents on their rings). Examples of the substituents may include alkyl groups, alkylene groups, and polar groups. A plurality of substituents may be bonded to the ring, and these substituents may be the same or different from each other. As the monomer having a norbornene structure, one type thereof may be solely used, or a two or more types thereof may be used in combination at any ratio.

Examples of the optional monomer copolymerizable with the monomer having a norbornene structure through ring-opening may include: monocyclic olefins such as cyclohexene, cycloheptene, and cyclooctene and derivatives thereof; and cyclic conjugated dienes such as cyclohexadiene and cycloheptadiene and derivatives thereof.

As the optional monomer copolymerizable with the monomer having a norbornene structure through ring-opening, one type thereof may be solely used, or a two or more types thereof may be used in combination at any ratio.

The ring-opening polymer of the monomer having a norbornene structure and the ring-opening copolymer of the monomer having a norbornene structure with an optional monomer copolymerizable therewith may be produced, e.g., by polymerization or copolymerization of the monomer(s) in the presence of a known ring-opening polymerization catalyst.

Examples of the monomer addition-copolymerizable with the monomer having a norbornene structure may include: α-olefins having 2 to 20 carbon atoms such as ethylene, propylene, and 1-butene and derivatives thereof; cycloolefins such as cyclobutene, cyclopentene, and cyclohexene, and derivatives thereof; and non-conjugated dienes such as 1,4-hexadiene, 4-methyl-1,4-hexadiene, and 5-methyl-1,4-hexadiene. Of these, α-olefins are preferable, and ethylene is more preferable. As the optional monomer addition-copolymerizable with the monomer having a norbornene structure, one type thereof may be solely used, or a two or more types thereof may be used in combination at any ratio.

The addition polymer of the monomer having a norbornene structure and the addition copolymer of the monomer having a norbornene structure with an optional monomer copolymerizable therewith may be produced, e.g., by polymerization or copolymerization of the monomer(s) in the presence of a known addition polymerization catalyst.

Examples of the monocyclic olefin-based polymer may include addition polymers of monocyclic olefin-based monomers such as cyclohexene, cycloheptene, and cyclooctene.

Examples of the cyclic conjugated diene-based polymer may include: polymers obtained by cyclization reaction of addition polymers of conjugated diene-based monomers such as 1,3-butadiene, isoprene, and chloroprene; 1,2- and 1,4- addition polymers of cyclic conjugated diene-based monomers such as cyclopentadiene and cyclohexadiene; and hydrogenated products thereof.

Examples of the vinyl alicyclic hydrocarbon polymers may include: polymers of vinyl alicyclic hydrocarbon-based monomers such as vinylcyclohexene and vinylcyclohexane and hydrogenated products thereof; hydrogenated products obtained by hydrogenating aromatic ring portions contained in polymers prepared by polymerization of vinyl aromatic hydrocarbon-based monomers such as styrene and α-methylstyrene; and aromatic ring hydrogenated products of copolymers, such as random copolymers and block copolymers, of vinyl alicyclic hydrocarbon-based monomers and vinyl aromatic hydrocarbon-based monomers with monomers copolymerizable with these vinyl aromatic hydrocarbon-based monomers. Examples of the block copolymers may include diblock copolymers, triblock copolymers, and higher multi-block copolymers, and graded block copolymers.

The glass transition temperature of the alicyclic structure-containing polymer is preferably 80° C. or higher and more preferably 90° C. or higher and is preferably 150° C. or lower, more preferably 120° C. or lower, and still more preferably 110° C. or lower. If the glass transition temperature is too low, durability at high temperature may deteriorate. Although the polymer having excessively high glass transition temperature may give high durability, usual stretching process on such a polymer may be difficult.

The glass transition temperature of the alicyclic structure-containing polymer is preferably equal to or lower than $Tg_A$-10° C. and more preferably equal to or lower than $Tg_A$-20° C., wherein $Tg_A$ is the glass transition temperature of the resin composition (A). When the glass transition temperature of the alicyclic structure-containing polymer is equal to or lower than the upper limit in the aforementioned range, rupture of the P1 layer under the stretching temperature conditions described later can be prevented, and a phase difference film with Δn, $Re_{550}$, and $Re_{450}/Re_{550}$ within desired ranges can be easily obtained.

The polycarbonate resin constituting the thermoplastic resin (B) is a resin containing a polycarbonate polymer. As the polycarbonate polymer, any polymer may be used so long as it has a repeating unit including a carbonate bond (—O—C(=O)—O—).

Particularly, the polycarbonate polymer is preferably a polycarbonate polymer containing a repeating unit A derived from bisphenol Z and represented by the chemical formula (II) below. Specific examples of the resin containing such a polycarbonate polymer may include LEXAN manufactured by SABIC.

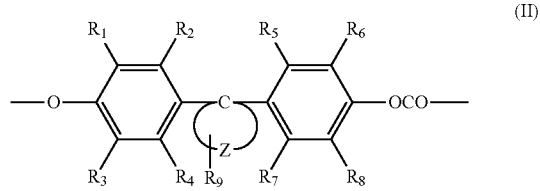

In the chemical formula (II), R1 to R8 are each independently a hydrogen atom, a halogen atom, or an alkyl group, cycloalkyl group or aryl group that is substituted or unsubstituted and has 1 to 10 carbon atoms. R9 is a hydrogen atom, an alkyl group having 1 to 9 carbon atoms, or an aryl group. Z is a residue forming a saturated or unsaturated carbon ring having 4 to 11 carbon atoms together with carbon atoms to which the residue is bonded. The carbon ring is preferably a saturated carbon ring having 6 carbon atoms. R1 (or R3) is preferably an alkyl group having 1 to 10 carbon atoms and more preferably a methyl group. R6 (or R8) is preferably an alkyl group having 1 to 10 carbon atoms and more preferably a methyl group. The repeating unit A represented by the chemical formula (II) above is preferably a repeating unit represented by the chemical formula (III).

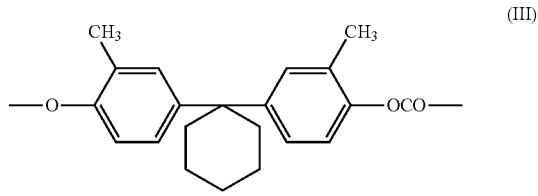

Preferably, the polycarbonate polymer further contains, in addition to the repeating unit A, a repeating unit B derived from bisphenol A and represented by the chemical formula (IV) below. Particularly preferably, the repeating unit B is a repeating unit represented by the chemical formula (V). In the combination of the repeating unit A and the repeating unit B, it is preferable that the amount of the repeating unit B represented by the chemical formula (IV) is 0.6 moles or more and 1.5 moles or less based on 1 mole of the repeating unit A represented by the chemical formula (II). When the composition of the polycarbonate polymer is within the aforementioned preferable range, a resin which expresses low degree of optical anisotropy during stretching can be formed.

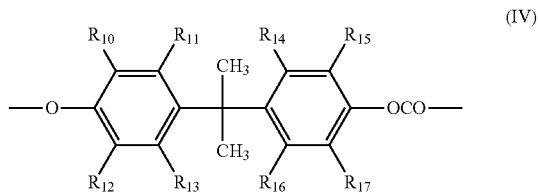

In the chemical formula (IV), $R_{10}$ to $R_{17}$ are each independently a hydrogen atom, a halogen atom, or an alkyl group, cycloalkyl group or aryl group that is substituted or unsubstituted and has 1 to 10 carbon atoms.

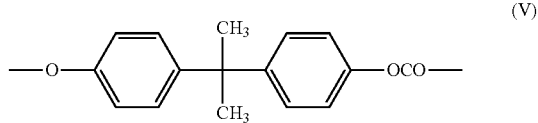

The glass transition temperature Tg of the polycarbonate resin is usually 80° C. or higher, preferably 90° C. or higher, more preferably 100° C. or higher, and particularly preferably 120° C. or higher and is preferably 160° C. or lower and more preferably 150° C. or lower. If the glass transition temperature is too low, durability at high temperature may deteriorate. Although the resin having excessively high glass transition temperature may give high durability, usual stretching process on such a resin may be difficult.

The thermoplastic resin (B) may contain, e.g., an additive. Examples of the additive may include the same additives as those that may be contained in the resin composition (A). As the additive, one type thereof may be solely used, or a two or more types thereof may be used in combination at any ratio. The amount of the additive may be appropriately set within the range in which the effects of the present invention are not significantly impaired.

(Method for Producing Phase Difference Film)

The phase difference film for use in the present invention includes a layer formed of the aforementioned resin composition (A). Usually, the resin composition (A) is molded to produce a long-length pre-stretch film, and the obtained pre-stretch film is subjected to stretching treatment to thereby obtain a phase difference film. A "long-length" film is a film having a length at least 5 times longer than its width and preferably 10 times longer than the width and is more specifically a film having a length that allows the film to be wound to be in a roll form for storage or conveyance. In a production line of such a long-length film, the long-length film is obtained by performing production steps continuously in the lengthwise direction of the film. Therefore, upon production of the phase difference film, part of or all the steps can be simply and efficiently performed in-line.

As the method for producing the pre-stretch film, e.g., a flow casting method may be used. However, melt extrusion molding is preferable from the viewpoint of production efficiency and from the viewpoint of avoiding existence of the residual volatile components such as a solvent in the film. The melt extrusion molding may be performed using, e.g., a T-die method.

The thickness of the pre-stretch film is preferably 10 µm or more and more preferably 120 µm or more and is preferably 800 µm or less and more preferably 200 µm or less. When the thickness is equal to or more than the lower limit in the aforementioned range, sufficient retardation and mechanical strength can be obtained. When the thickness is equal to or less than the upper limit in the aforementioned range, favorable flexibility and handleability can be obtained.

By stretching the obtained pre-stretch film, the film expresses retardation, and a phase difference film is thereby obtained. In this case, the expressed retardation has inverse wavelength distribution property. The mechanism of the expression of inverse wavelength distribution property is deduced to be as follows.

Usually, in the visible wavelength range of 400 nm to 700 nm, the wavelength distribution property of the polyarylene ether having a positive intrinsic birefringence value is higher than the wavelength distribution property of the polystyrene-based polymer having the syndiotactic structure and having a negative intrinsic birefringence value. In the resin composition (A) in the present invention, e.g., the formulation and other factors of the polyarylene ether and the polystyrene-based polymer having the syndiotactic structure are adjusted such that the influence by the orientation of the polystyrene-based polymer having the syndiotactic structure is slightly larger than the influence by the orientation of the polyarylene ether on the short-wavelength side, and such that the influence by the orientation of the polystyrene-based polymer having the syndiotactic structure appears more remarkably as the wavelength approaches toward the long-wavelength side.

The retardation expressed after the pre-stretch film is stretched is usually the difference between the retardation expressed by the orientation of the polyarylene ether contained in the resin composition (A) in the present invention and the retardation expressed by the orientation of the polystyrene-based polymer having the syndiotactic structure. Therefore, when the adjustment is effected such that the influence of the polystyrene-based polymer having the syndiotactic structure appears more remarkably as the wavelength approaches toward the long-wavelength side as described above, a phase difference film having inverse wavelength distribution property can be obtained.

The stretching operation to be employed may be; a method in which uniaxial stretching is performed in the lengthwise direction by utilizing the difference in peripheral speed between rolls (longitudinal uniaxial stretching); a method in which uniaxial stretching is performed in the width direction using a tenter (crosswise uniaxial stretching); a method in which longitudinal uniaxial stretching and crosswise uniaxial stretching are performed sequentially (sequential biaxial stretching); or a method in which stretching is performed in a diagonal direction with respect to the lengthwise direction of the pre-stretch film (diagonal stretching). Particularly, diagonal stretching is preferably used because the diagonal stretching usually gives a long-length phase difference film having a slow axis in a diagonal direction, which in turn can reduce waste upon cutting rectangular products out of the long-length phase difference film and can realize efficient production of the phase difference film having a large surface area. The "diagonal direction" means a direction that is non-parallel, non-orthogonal direction.

Specific examples of the method for diagonal stretching may include a stretching method using a tenter stretching machine. Examples of the tenter stretching machine may include a tenter stretching machine that can apply feeding force, tensile force, or drawing force with different speeds to the left and right edges of the pre-stretch film (i.e., the left and right width-end edges of the pre-stretch film when the film conveyed horizontally is observed in the MD direction). Another example is a tenter stretching machine which can achieve diagonal stretching by applying feeding force, tensile force, or drawing force in the TD or MD direction with the same speed to the left and right edges, and by having non-linear left and right tracks with the same moving distance. Still another example is a tenter stretching machine in which the left and right edges are moved at different distances to achieve diagonal stretching.

When stretching is performed in a diagonal direction, it is preferable to perform stretching in such a direction that the angle of the stretching direction with respect to the lengthwise direction of the pre-stretch film is 40° or more and 50° or less. In this manner, a phase difference film having an orientation angle within the range of 40° or more and 50° or less with respect to the lengthwise direction can be obtained. The "orientation angle" is the angle between the MD direction of the long-length phase difference film and the in-plane slow axis of the phase difference film.

When the phase difference film is used as a rectangular film piece, it is preferable that the film piece has a slow axis within the range of 40° or more and 50° or less with respect to the direction of the edge of the rectangular shape. In such a case, when the orientation angle is within the range of 40° or more and 50° or less with respect to the lengthwise direction, the rectangular film product can be cut out from the long-length phase difference film simply by cutting out the rectangular film piece with its edges being in the direction parallel to or orthogonal to the lengthwise direction, whereby efficient production can be performed and area size can be easily enlarged.

The temperature of the film during stretching is preferably equal to or higher than $Tg_A-20°$ C., more preferably equal to or higher than $Tg_A-15°$ C., and still more preferably equal to or higher than $Tg_A-13°$ C., wherein $Tg_A$ is the glass transition temperature of the resin composition (A). The temperature of the film during stretching is preferably equal to or lower than $Tg_A+20°$ C., more preferably equal to or lower than $Tg_A+2°$ C., still more preferably equal to or lower than $Tg_A+1°$ C., yet more preferably equal to or lower than $Tg_A-2°$ C., and particularly preferably equal to or lower than $Tg_A-11°$ C.

The stretching ratio is preferably 1.2 to 6 times and more preferably 2.5 to 5.0 times. When the stretching ratio is within this range, a thin phase difference film that satisfies the relation $Re_{450}<Re_{550}<Re_{650}$ and has $Re_{550}$ within a desired range can be easily obtained. The number of stretching operations may be one or may be two or more.

When the phase difference film is produced, a step other than those described above may be performed. For example, the pre-stretch film may be subjected to pre-heat treatment before stretching.

In the aforementioned method for producing the phase difference film, the long-length pre-stretch film may be a long-length pre-stretch film layered body, including a P1 layer formed of the resin composition (A) and a P2 layer formed of the thermoplastic resin (B). The pre-stretch film layered body may include only one P2 layer but preferably includes two or more P2 layers. Particularly preferred examples of the pre-stretch film layered body may include a pre-stretch film layered body including a first P2 layer, a P1 layer, and a second P2 layer in this order. In such a pre-stretch film layered body, the P1 layer can be protected by the high-strength P2 layers that sandwich the P1 layer from opposite sides, so that bleedout from the P1 layer can be effectively prevented. The bleedout from the P1 layer is a phenomenon in which part of the components (for example, an additive) contained in the P1 layer bleeds out through the surface of the P1 layer.

Examples of the method for producing the pre-stretch film layered body may include: co-extrusion molding methods such as a co-extrusion T-die method, a co-extrusion inflation method, and a co-extrusion lamination method; film lamination forming methods such as dry lamination; a co-flow casting method; and a coating forming method in which the surface of a resin film is coated with a resin solution. Of these, co-extrusion molding methods are preferable from the viewpoint of production efficiency and of avoiding existence of the residual volatile component such as a solvent in the pre-stretch film layered body.

When the co-extrusion molding method is used, the pre-stretch film layered body may be obtained by, e.g., co-extrusion of the resin composition (A) and the thermoplastic resin (B). Examples of the co-extrusion molding method may include a co-extrusion T-die method, a co-extrusion inflation method, and a co-extrusion lamination method. Of these, the co-extrusion T-die method is preferable. Examples of the co-extrusion T-die method may include a feed block procedure and a multi-manifold procedure. The multi-manifold procedure is particularly preferable because thickness variations can thereby be reduced.

When the co-extrusion T-die method is used, the temperature for melting the resins in an extruder having a T-die is set to a temperature higher than the glass transition temperatures of the resin composition (A) and the thermoplastic resin (B) by preferably 80° C. or more and more preferably 100° C. or more and by preferably 180° C. or less and more preferably 150° C. or less. By setting the melting temperature in the extruder to be equal to or higher than the lower limit in the aforementioned range, the flowability of the resins can be sufficiently increased. By setting the melting temperature to be equal to or lower than the upper limit, deterioration of the resins can be prevented.

By stretching the pre-stretch film layered body, a phase difference film layered body is obtained which includes a layer formed by the stretching of the P1 layer formed of the resin composition (A) (this layer may be referred to hereinbelow as a "p1 layer") and a layer formed by the stretching of the P2 layer formed of the thermoplastic resin (B) (this layer may be referred to hereinbelow as a "p2 layer"). As the stretching method, any of the aforementioned methods may be used.

When the phase difference film layered body as its entirety satisfies the relation $Re_{450}<Re_{550}<Re_{650}$ and has an Nz coefficient of −0.25 to −0.05 at a wavelength of 550 nm, the phase difference film layered body as it is may be used as the phase difference film for the organic EL display device of the present invention. In this case, from the viewpoint of effectively utilizing the phase difference expressed in the p1 layer to obtain desired optical properties, it is preferable that the absolute value of the phase difference expressed by stretching in the p2 layer is small, and it is more preferable that no phase difference is expressed in the p2 layer. More specifically, in-plane direction retardation in the p2 layer is more than 1 nm and less than 10 nm.

In this case, the stretching temperature of the pre-stretch film is preferably higher than $Tg_B$ by 10° C. or more and more preferably higher than $Tg_B$ by 20° C. to 60° C., wherein $Tg_B$ is the glass transition temperature of the thermoplastic resin (B). The stretching ratio in this case is preferably 1.1 to 6 times. When stretching is performed under such conditions, rupture of the P1 layer during stretching can be prevented, and the in-plane direction retardation of the p2 layer can be adjusted within the aforementioned range.

Alternatively, a phase difference film may be obtained by removing the p2 layer from the phase difference film layered body. In this case, it is not necessary to take the phase difference expressed in the p2 layer into consideration. Therefore, the thickness of the P2 layer in the pre-stretch film layered body and the stretching conditions may be set such that desired optical properties are expressed in the p1 layer. When the p2 layer is removed, it is preferable, from the viewpoint of the ease of removal, to use an acrylic resin or an alicyclic structure-containing polymer as the thermoplastic resin (B). The specific range of the thickness of the P2 layer in the pre-stretch film layered body is preferably equal to or more than 0.3 times the thickness of the P1 layer, more preferably equal to or more than 0.5 times, still more preferably equal to or more than 1.0 times, and particularly preferably equal to or more than 2.0 times and is preferably equal to or less than 5.0 times and more preferably equal to or less than 3.0 times. When the pre-stretch film layered body has a plurality of P2 layers, it is preferable that each single layer has a thickness within the aforementioned range.

Particularly preferably, a phase difference film is obtained by: stretching a pre-stretch film layered body including a first P2 layer, a P1 layer, and a second P2 layer in this order to obtain a phase difference film layered body including a first p2 layer, a p1 layer, and a second p2 layer in this order; and removing the first and second p2 layers from the phase difference film layered body. With this method, the P1 layer can be protected by the high-strength P2 layers that sandwich the P1 layer from opposite sides, rupture of the P1 layer can be prevented, and stretching at a high stretching ratio can be performed. Stretching performed at a high stretching ratio brings about expression of large phase difference by the orientation of the resin composition (A), so that thickness of the p1 layer can be reduced. Since the p2 layers are removed, the thickness of the obtained phase difference film can be reduced, and a reduction in thickness of the organic EL display device of the present invention can be achieved.

(Hard-Coat Layer)

It is preferable that the aforementioned phase difference film has a hard-coat layer on one or more of its surfaces. The phase difference film may have a hard-coat layer only on one surface or may have hard-coat layers on both surfaces. Preferably, the phase difference film has a hard-coat layer at least on a surface opposite to the surface on the side on which the polarizing film is stacked. When the phase difference film has a hard-coat layer, the anti-reflection effect and strength of the circularly polarizing plate can be further improved.

The hard-coat layer is a layer for reinforcing the hardness of a protective film and preferably has a hardness of "H" or higher as measured by a pencil hardness test (a glass plate is used as a test plate) in accordance with JIS K5600-5-4. Preferably, the phase difference film having such a hard-coat layer has a pencil hardness of 4H or higher. The material for forming the hard-coat layer (a hard-coat material) is preferably a thermosetting or photocurable material, and examples of such a material may include: organic hard-coat materials such as organic silicone-based, melamine-based, epoxy-based, acrylic-based, and urethane acrylate-based materials; and inorganic hard-coat materials such as silicon dioxide. Of these, urethane acrylate-based and polyfunctional acrylate-based hard-coat materials are preferably used as the hard-coat material because of their high adhesion and good productivity.

No limitation is imposed on the thickness of the hard-coat layer. The thickness is appropriately determined and is preferably 1 µm to 20 µm and more preferably 3 µm to 10 µm.

If necessary, the hard-coat layer may contain a variety of fillers, in order to adjust the refractive index of the hard-coat layer, improve its bending elastic modulus, stabilize its volumetric shrinkage rate, and to improve its heat resistance, antistatic properties, antiglare properties, etc. The hard-coat layer may further contain additives such as an antioxidant, an ultraviolet absorber, a light stabilizer, an antistatic agent, a leveling agent, and an antifoaming agent.

Examples of the filler for adjusting the refractive index and antistatic properties of the hard-coat layer may include titanium oxide, zirconium oxide, zinc oxide, tin oxide, cerium oxide, antimony pentoxide, tin-doped indium oxide (ITO), antimony-doped tin oxide (IZO), aluminum-doped zinc oxide (AZO), and fluorine-doped tin oxide (FTO)). The filler is preferably antimony pentoxide, ITO, IZO, ATO, or FTO for maintaining transparency. The primary particle diameter of the filler is usually 1 nm to 100 nm and preferably 1 nm to 30 nm.

As the filler for imparting antiglare properties, those having an average particle diameter of 0.5 µm to 10 µm are preferable. Those having an average particle diameter of 1.0 µm to 7.0 µm are more preferable, those having an average particle diameter of 1.0 µm to 4.0 µm are still more preferable. Specific examples of the filler for imparting antiglare properties may include: fillers formed of organic resins such as polymethyl methacrylate resins, vinylidene fluoride resins, other fluorine resins, silicone resins, epoxy resins, nylon resins, polystyrene resins, phenolic resins, polyurethane resins, cross-linked acrylic resins, cross-linked polystyrene resins, melamine resins, and benzoguanamine resins; and fillers formed of inorganic compounds such as titanium oxide, aluminum oxide, indium oxide, zinc oxide, antimony oxide, tin oxide, zirconium oxide, ITO, magnesium fluoride, and silicon oxide.

The refractive index of the hard-coat layer is preferably 1.57 to 1.61. When the refractive index of the hard-coat layer is within the aforementioned range, a good anti-reflection effect is obtained.

The phase difference film for use in the present invention may further include an optional layer such as a mat layer for improving the slidability of the film, an anti-reflection layer, or an anti-fouling layer.

(Polarizing Film)

The circularly polarizing plate for use in the present invention is formed by stacking a polarizing film and the aforementioned phase difference film. Specifically, the polarizing film and the phase difference film are stacked such that the angle between the slow axis of the phase difference film and the absorption axis of the polarizing film is within the range of 40° or more and 50° or less.

The polarizing film for stacking is preferably a long-length polarizing film having an absorption axis in its lengthwise direction. This is because the direction of the slow axis of the phase difference film and the direction of the absorption axis of the polarizing plate can thereby be set to appropriate angles by simply stacking the long-length phase difference film and the long-length polarizing film with their longitudinal axis directions aligned with each other, and this facilitates production of the circularly polarizing plate.

The long-length polarizing film may be produced by, e.g., causing iodine or a dichromatic dye to be adsorbed onto a polyvinyl alcohol film and then uniaxially stretching the resultant film in a boric acid bath. The long-length polarizing film may also be produced, e.g., by causing iodine or a dichromatic dye to be adsorbed onto a polyvinyl alcohol film, stretching the resultant film, and then modifying part of the polyvinyl alcohol units in the molecular chain into polyvinylene units. Further, as the polarizing film, a polarizing film having a function of separating polarized light into reflected light and transmitted light, such as a grid polarizing plate or a multi-layer polarizing plate may also be used. Of these, a polarizing film containing polyvinyl alcohol is preferable. The degree of polarization of the polarizing film is preferably 98% or more and more preferably 99% or more. The thickness (average thickness) of the polarizing film is preferably 5 µm to 80 µm.

Upon stacking the polarizing film and the phase difference film, an adhesive may be used. No particular limitation is imposed on the adhesive so long as it is optically transparent. Examples of the adhesive may include water-based adhesives, solvent-type adhesives, two-component curing adhesives, ultraviolet curable adhesives, and pressure sensitive adhesives. Of these, water-based adhesives are preferable, and polyvinyl alcohol-based water-based adhesives are particularly preferable. As the adhesive, one type thereof may be solely used, or a two or more types thereof may be used in combination at any ratio.

The average thickness of the layer formed of the adhesive (adhesive layer) is preferably 0.05 µm or more and more preferably 0.1 µm or more and is preferably 5 µm or less and more preferably 1 µm or less.

No limitation is imposed on the method for stacking the phase difference film on the polarizing film. A preferred method includes applying the adhesive to one surface of the polarizing film, laminating the polarizing film and the phase difference film using a roll laminator, and then drying the laminate. Before lamination, the surface of the phase difference film may be subjected to surface treatment such as corona discharge treatment or plasma treatment. The drying time and drying temperature may be appropriately selected in accordance with the type of adhesive.

If necessary, the obtained circularly polarizing plate is cut into an appropriate size, to be used as an anti-reflection film for the organic EL display device of the present invention. An organic EL display device having favorable visibility even in the presence of external light can be provided by disposing such an anti-reflection film on the light-emitting side of the organic EL display device with the phase difference film disposed toward the light-emitting layer of the organic EL display device.

(Substrate)

No particular limitation is imposed on the substrate for use in the organic EL display device of the present invention, so long as the substrate is transparent. The thickness of the substrate is usually about 50 μm to about 2.0 mm. Examples of the material used for the substrate may include glass materials, resin materials, and composite materials thereof. Examples of the composite materials may include a glass plate with a plastic protective film or layer provided thereon.

Examples of the resin materials and the material of the protective plastic may include fluorine resins, polyethylene, polypropylene, polyvinyl chloride, polyvinyl fluoride, polystyrenes, ABS resins, polyamides, polyacetals, polyesters, polycarbonates, modified polyphenylene ethers, polysulfones, polyarylates, polyetherimides, polyamide-imides, polyimides, polyphenylene sulfides, liquid crystalline polyesters, polyethylene terephthalates, polybutylene terephthalates, polyethylene naphthalates, polyoxymethylenes, polyethersulfones, polyether ether ketones, polyacrylates, acrylonitrile-styrene resins, phenolic resins, urea resins, melamine resins, unsaturated polyester resins, epoxy resins, polyurethanes, silicone resins, and amorphous polyolefin. Other resin materials can also be used so long as the materials are polymer materials that may be used for the organic EL display device.

Although it depends on the application of the organic EL display device, it is more preferable that the substrate has high gas barrier properties against water vapor, oxygen, etc. A gas barrier layer for preventing transmission of water vapor, oxygen, etc. may be formed on the substrate. For example, the gas barrier layer is preferably a layer of an inorganic oxide such as silicon oxide, aluminum oxide, or titanium oxide formed by a physical vapor deposition method such as a sputtering method or a vacuum vapor deposition method.

(Transparent Electrode)

The transparent electrode is usually used as a positive electrode and forms an electrode wiring pattern together with signal lines and scan lines formed on the substrate and TFTs (thin-film transistors) serving as driving elements. No particular limitation is imposed on the material of the transparent electrode so long as it is a material used for general organic EL display devices, and metals, alloys, mixtures thereof, etc. may be used. Specific examples of the material of the transparent electrode may include thin-film electrode materials such as indium tin oxide (ITO), indium oxide, indium zinc oxide (IZO), zinc oxide, stannic oxide, and gold. Preferably, the transparent electrode is formed of a transparent material having a large work function (4 eV or higher), such as ITO, IZO, indium oxide, or gold, for facilitating hole injection. The sheet resistance of the transparent electrode is preferably several hundred ohms/square or less, and its thickness is, e.g., about 0.005 μm to about 1 μm, although the thickness may depend on the material.

(Luminescent Layer)

No particular limitation is imposed on the luminescent layer of the luminescent element so long as the light-emitting layer is usually used for organic EL display devices, and any of low-molecular and polymer light-emitting layers may be used. For example, the luminescent layer may have a structure in which a hole injection layer, the luminescent layer, and an electron induction layer are formed in this order from the transparent electrode layer side, a structure including only the luminescent layer, a structure including a hole injection layer and the luminescent layer, a structure including the luminescent layer and an electron induction layer, a structure in which a hole transport layer is interposed between a hole injection layer and the luminescent layer, or a structure in which an electron transport layer is interposed between the luminescent layer and an electron induction layer. Each of the materials of the aforementioned layers may be doped with a suitable material for adjusting the wavelength of light luminescence and for improving the luminescence efficiency.

(Metal Electrode Layer)

The metal electrode layer is usually used as a negative electrode. No particular limitation is imposed on the material of the metal electrode layer, so long as it is a material used for general organic EL display devices. Examples of the material may include gold, magnesium alloys (such as MgAg), aluminum, aluminum alloys (such as AlLi, AlCa, and AlMg), and silver. Preferably, the metal electrode layer is formed of a magnesium alloy, aluminum, silver, etc. having a small work function (4 eV or lower), for facilitating electron injection. The sheet resistance of the metal electrode layer is preferably several hundred ohms/square or less, and therefore its thickness is preferably, e.g., about 0.005 μm to about 0.5 μm.

EXAMPLES

The present invention will be specifically described by way of Examples. However, the present invention is not limited to the following Examples. The present invention may be implemented with any modifications without departing the scope of the claims of the present invention and equivalents thereto. Unless otherwise specified, "part" and "%" In the Examples and Comparative Examples are based on weight. "Mw" represents a weight average molecular weight.

In the Examples and Comparative Examples, respective properties were measured as follows.

(Film Thicknesses)

The thicknesses of the respective layers of a film and the overall thickness of the film were measured as follows. The film was embedded in an epoxy resin and sliced using a microtome ("RUB-2100" manufactured by YAMATO KOHKI INDUSTRIAL Co., Ltd.), and the cross-section was observed under a scanning electron microscope for measurement.

[Retardation, Nz Coefficient, and Birefringence]

The surface of a phase difference film was polished with an abrasive cloth for plastics to obtain each layer as a single layer. For each single layer, a refractive index nx in the direction of a slow axis of the layer, a refractive index ny in an in-plane direction orthogonal to the slow axis of the layer, and a refractive index nz in a thickness direction were measured at measurement wavelengths of 450 nm, 550 nm, and 650 nm using a spectroscopic ellipsometer M-2000U manufactured by J. A. Woollam. The retardation Re of each layer at each wavelength, its Nz coefficient at a wavelength of 550 nm, and its birefringence Δn at a wavelength of 550 nm were calculated from the aforementioned values and thickness d (nm) of the each layer in accordance with the following formulas.

$$Re = |nx - ny| \times d$$

$$Nz = (nx - nz)/(nx - ny)$$

$$\Delta n = nx - ny$$

[Glass Transition Temperature]

Measurement was performed using a differential scanning calorimeter ("EXSTAR6220" manufactured by Seiko Instruments Inc.) at a temperature increase rate of 20° C./min.

[Strength (Flexibility)]

Whether or not rupture occurred when a long-length phase difference film and a long-length polarizer were continuously laminated was evaluated in accordance with the following criteria.

A: No rupture occurred during lamination from feeding, and the films were capable to be laminated over their entire length.

B: Rupture occurred several times during lamination from feeding.

(Viewing Angle Characteristics of Organic EL Display Device)

As to a model in which a reflecting plate and a circularly polarizing plate were stacked such that the phase difference film of the circularly polarizing plate was in contact with the reflecting plate, optical simulations with a 4×4 matrix were performed to calculate contrast and color tone, and the results were displayed as a contrast map and a color tone map (a diagram representing color shifts). In the contrast map, darker color is indicative of higher contrast. In the color tone map, lighter color is indicative of larger color shift.

The circularly polarizing plate was disposed on a glass substrate of an organic EL display device such that the phase difference film was in contact with the glass substrate. The display characteristics when the display device was observed obliquely in upward, downward, left, and right directions were visually checked and judged in accordance with the following criteria.

A: No reflection of an external scenery and no change in color tone were found.

B: A slight reflection of an external scenery and a slight change in color tone were found.

C: A small reflection of an external scenery and a small change in color tone were found.

D: A significant reflection of an external scenery and a significant change in color tone were found.

Example 1

Production of Pre-Stretch Film

58 Parts of syndiotactic polystyrene ("XAREC 130ZC" manufactured by Idemitsu Kosan Co., Ltd., Mw: 180,000), 42 parts of poly(2,6-dimetyl-1,4-phenylene oxide) (catalog No. 18242-7, ALDRICH), and 1 part of an antioxidant were kneaded in a twin screw extruder to produce pellets of a transparent resin composition (A). The glass transition temperature of the resin composition (A) was 134° C.

As the thermoplastic resin (B), pellets of an acrylic resin ("HT55Z" manufactured by Sumitomo Chemical Co., Ltd., glass transition temperature: 108° C.) containing an acrylic polymer and rubber particles were fed to one of the single screw extruders of a film forming apparatus, and melted.

The pellets of the aforementioned resin composition (A) were fed to another one of the single screw extruders of the film forming apparatus, and melted.

A film forming apparatus for two-type three-layer co-extrusion molding was prepared, and the melted thermoplastic resin (B) was passed through a polymer filter having a leaf disc shape and an opening of 10 μm and then supplied to one of manifolds of a multi-manifold die (surface roughness of a die lip: Ra=0.1 μm) of the film forming apparatus.

The melted resin composition (A) was passed through a polymer filter having a leaf disc shape and an opening of 10 μm, and then supplied to another one of the manifolds of the film forming apparatus.

The thermoplastic resin (B) and the resin composition (A) were simultaneously extruded from the multi-manifold die at 260° C. while the extrusion conditions were controlled so that resin layers with desired thicknesses were obtained, whereby the resins were formed into a film shape having a three-layer structure of (a P2 layer formed of the thermoplastic resin (B))/(a P1 layer formed of the resin composition (A))/(a P2 layer formed of the thermoplastic resin (B)). The melted resins co-extruded into a film shape were casted onto a cooling roller having a surface temperature adjusted to 115° C. and then passed between two cooling rollers having a surface temperature adjusted to 120° C. In this manner, a pre-stretch film layered body of a three-layer structure having the P2 layer, the P1 layer, and the P2 layer in this order was obtained (co-extrusion step). The ratio of the thicknesses of these layers was P2 layer:P1 layer:P2 layer=2:1:2.

(Production of Stretched Film)

Subsequently, this pre-stretch film layered body was diagonally stretched using a tenter stretching machine such that the slow axis was inclined at an angle of 45° with respect to the MD direction. The temperature during stretching was set to 131° C., which was a temperature lower than the glass transition temperature of the resin composition (A) by 3° C., and the stretching ratio was set to 3.2 times. A phase difference film layered body having a three-layer structure of (a p2 layer formed of the thermoplastic resin (B))/(a p1 layer formed of the resin composition (A))/(a p2 layer formed of the thermoplastic resin (B)) was thereby obtained. The ratio of the thicknesses of these layers was p2 layer:p1 layer:p2 layer=2:1:2. Subsequently, the p2 layers on both sides were removed from the phase difference film layered body to obtain a long-length 49 μm-thick phase difference film A consisting only of the p1 layer. The obtained phase difference film A was wound to form a film roll. The orientation of the phase difference film A was checked, and the slow axis was found to be inclined at an angle of 45° with respect to the MD direction. The $Re_{550}$ of the phase difference film A was 140 nm. The phase difference film A satisfied the relation $Re_{450} < Re_{550} < Re_{650}$, and $Re_{450}/Re_{550}$ was 0.87. Δn was 0.0028, and the Nz coefficient was −0.12.

(Production of Circularly Polarizing Plate)

A long-length 80 μm-thick polyvinyl alcohol film was stained in a 0.3% aqueous iodine solution. Then the resultant film was stretched at a ratio of 5 times in a 4% aqueous boric acid solution and a 2% aqueous potassium iodide solution and dried at 50° C. for 4 minutes to produce a long-length polarizer.

The phase difference film A was continuously fed from the roll, and laminated onto one surface of the long-length polarizer with a roll laminator using an adhesive. During lamination from feeding, no rupture occurred, and the films were capable to be laminated over their entire length. From the laminated films, a rectangular shape piece was cut out to produce a circularly polarizing plate A.

Figure 2:
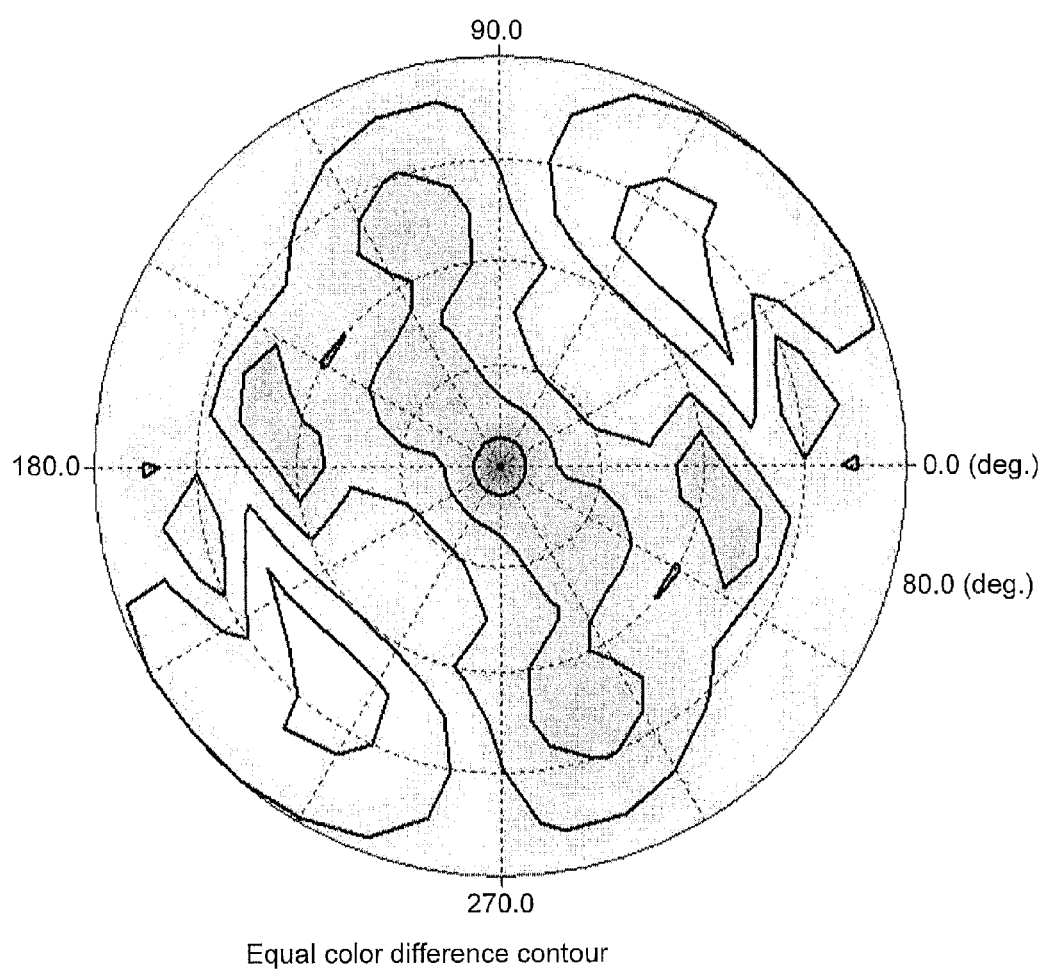
FIG. 2 is a color tone map of the organic EL display device obtained in Example 1.

Using a model in which this circularly polarizing plate A was used, optical simulations with a 4×4 matrix were performed to calculate contrast and color tone, and the results were displayed as a contrast map and a color tone map. The results are shown in FIGS. 1 and 2. In addition, the circularly polarizing plate A was applied to an organic EL display device, and viewing angle characteristics from upward, downward, left, and right directions were visually checked. The results are shown in Table 1.

Example 2

Pellets of transparent resin composition (A) were prepared in the same manner as in Example 1 except that the amount of syndiotactic polystyrene was changed to 57 parts and the amount of poly(2,6-dimetyl-1,4-phenylene oxide) was changed to 43 parts. The glass transition temperature of the resin composition (A) was 136° C. A pre-stretch film layered body of a three-layer structure having a P2 layer, a P1 layer, and a P2 layer in this order was obtained in the same manner as in Example 1 except that the resin composition (A) thus produced was used (co-extrusion step). The ratio of the thicknesses of these layers was P2 layer:P1 layer:P2 layer=3:1:3.

Subsequently, this pre-stretch film layered body was diagonally stretched using a tenter stretching machine at a stretching ratio of 2.8 times such that the slow axis was inclined at an angle of 45° with respect to the MD direction. The temperature during stretching was set to 121° C., which was a temperature lower than the glass transition temperature of the resin composition (A) by 15° C. A phase difference film layered body having a three-layer structure of (a p2 layer formed of the thermoplastic resin (B))/(a p1 layer formed of the resin composition (A))/(a p2 layer formed of the thermoplastic resin (B)) was thereby obtained. The ratio of the thicknesses of these layers was p2 layer:p1 layer:p2 layer=3:1:3. Subsequently, the p2 layers on both sides were removed from the phase difference film layered body to obtain a long-length 35 μm-thick phase difference film B consisting only of the p1 layer. The obtained phase difference film B was wound to form a film roll. The orientation of the phase difference film B was checked, and the slow axis was found to be inclined at an angle of 45° with respect to the MD direction. The $Re_{550}$ of the phase difference film B was 141 nm. The phase difference film B satisfied the relation $Re_{450}<Re_{550}<Re_{650}$, and $Re_{450}/Re_{550}$ was 0.88. Δn was 0.0040, and the Nz coefficient was −0.14.

Figure 3:
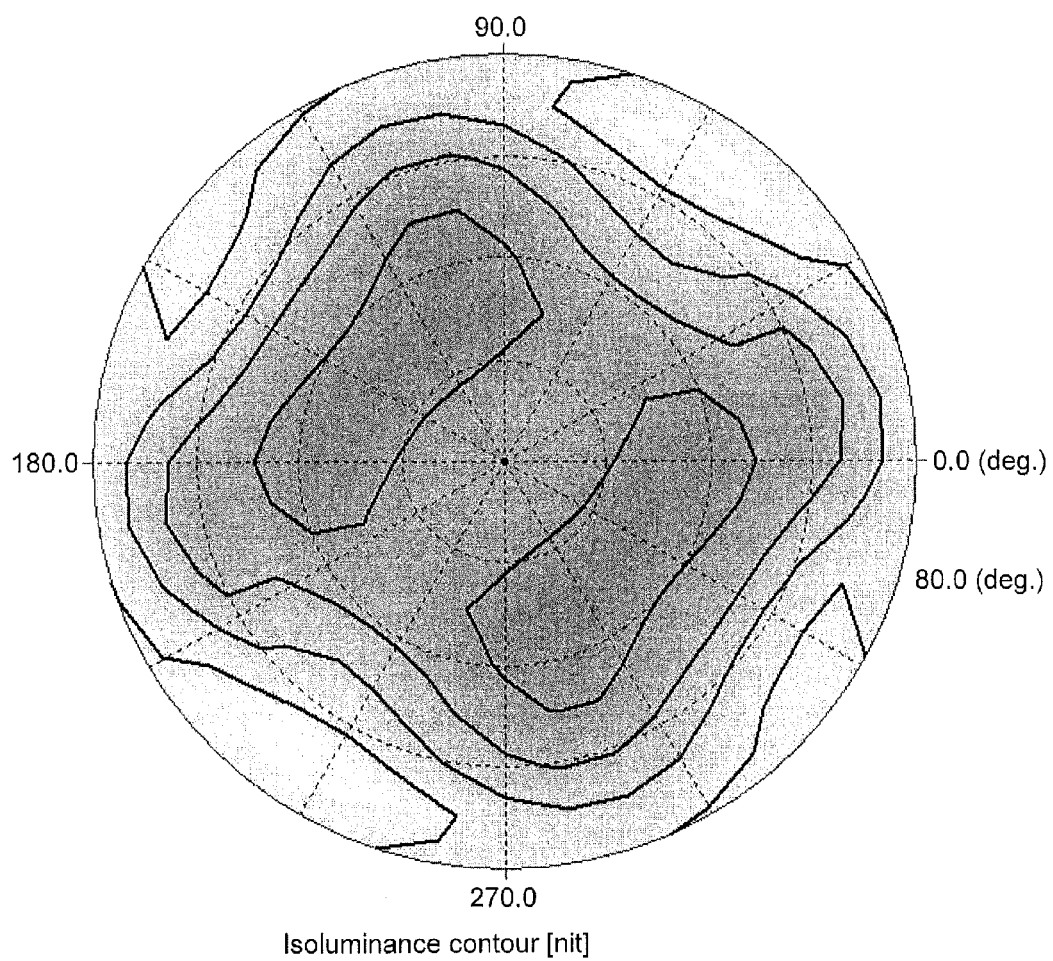
FIG. 3 is a contrast map of an organic EL display device obtained in Example 2.
Figure 4:
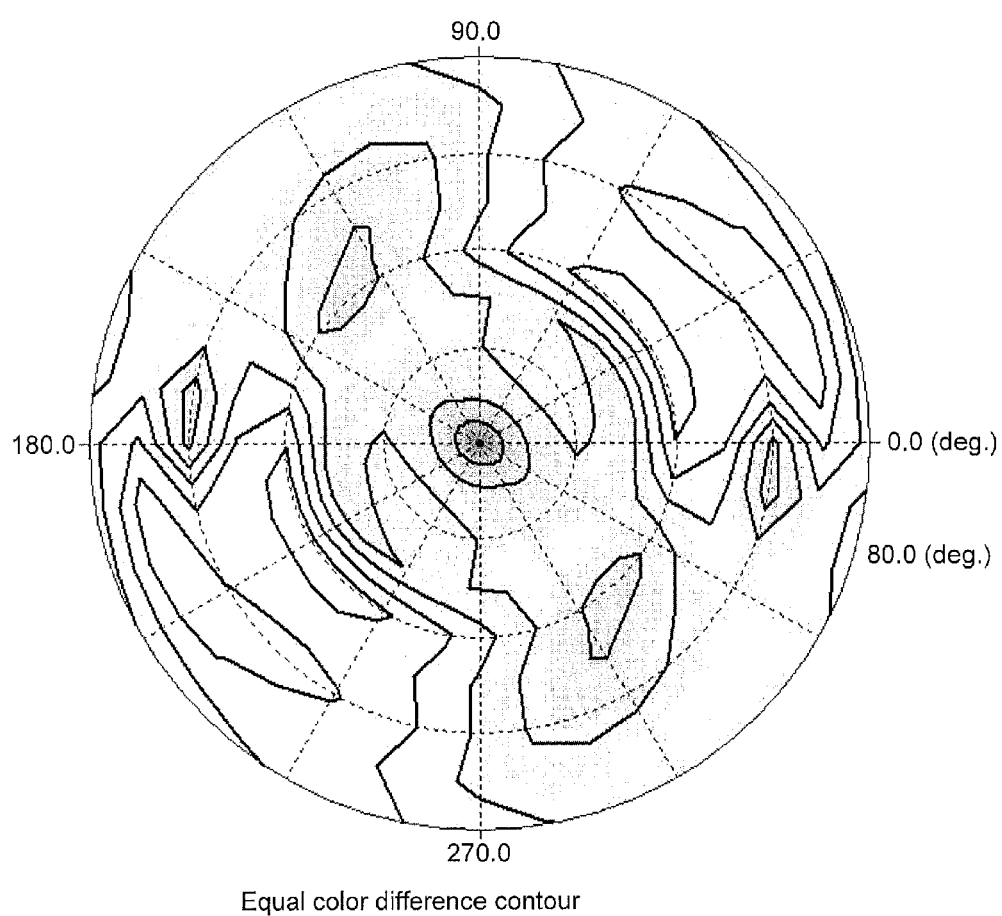
FIG. 4 is a color tone map of the organic EL display device obtained in Example 2.

Using the aforementioned phase difference film B, a circularly polarizing plate B was produced in the same manner as in Example 1. During lamination from feeding from the roll, no rupture occurred in the phase difference film B, and the films were capable to be laminated over their entire length. Using the obtained circularly polarizing plate B, contrast and color tone were calculated, and viewing angle characteristics of an organic EL display device was evaluated. The results are shown in FIGS. 3 and 4 and Table 1.

Example 3

Pellets of transparent resin composition (A) were prepared in the same manner as in Example 1 except that the amount of syndiotactic polystyrene was changed to 64 parts and the amount of poly(2,6-dimetyl-1,4-phenylene oxide) was changed to 36 parts. The glass transition temperature of the resin composition (A) was 127° C. A pre-stretch film layered body having a three-layer structure of a P2 layer, a P1 layer, and a P2 layer in this order was obtained in the same manner as in Example 1 except that the resin composition (A) thus prepared was used as the resin composition (A), and that pellets of a resin ("ZEONOR1060" manufactured by ZEON CORPORATION, glass transition temperature: 100° C.) containing an alicyclic structure-containing polymer were used as the thermoplastic resin (B) (co-extrusion step). The ratio of the thicknesses of these layers was P2 layer:P1 layer:P2 layer=1:1:1.

Subsequently, this pre-stretch film layered body was subjected to longitudinal uniaxial stretching using a tenter stretching machine at a stretching ratio of 1.4 times in the MD direction and then subjected to diagonal stretching at a stretching ratio of 1.6 times such that the slow axis was inclined at an angle of 45° with respect to the MD direction. The temperatures during stretching, i.e., the temperature during longitudinal uniaxial stretching and the temperature during diagonal stretching, were set to 129° C., which was a temperature higher than the glass transition temperature of the resin composition (A) by 2° C. A phase difference film layered body having a three-layer structure of (a p2 layer formed of the thermoplastic resin (B))/(a p1 layer formed of the resin composition (A))/(a p2 layer formed of the thermoplastic resin (B)) was thereby obtained. The ratio of the thicknesses of these layers was p2 layer:p1 layer:p2 layer=1:1:1. Subsequently, the p2 layers on both sides were removed from the phase difference film layered body to obtain a long-length 99 μm-thick phase difference film C consisting only of the p1 layer. The obtained phase difference film C was wound to form a film roll. The orientation of the phase difference film C was checked, and the slow axis was found to be inclined at an angle of 45° with respect to the MD direction. The $Re_{550}$ of the phase difference film C was 139 nm. The phase difference film C satisfied the relation $Re_{450}<Re_{550}<Re_{650}$, and $Re_{450}/Re_{550}$ was 0.96. Δn was 0.0014, and the Nz coefficient was −0.22.

Using the aforementioned phase difference film C, an attempt was made to produce a circularly polarizing plate in the same manner as in Example 1. However, rupture in the phase difference film C occurred several times during lamination from feeding from the roll.

Figure 5:
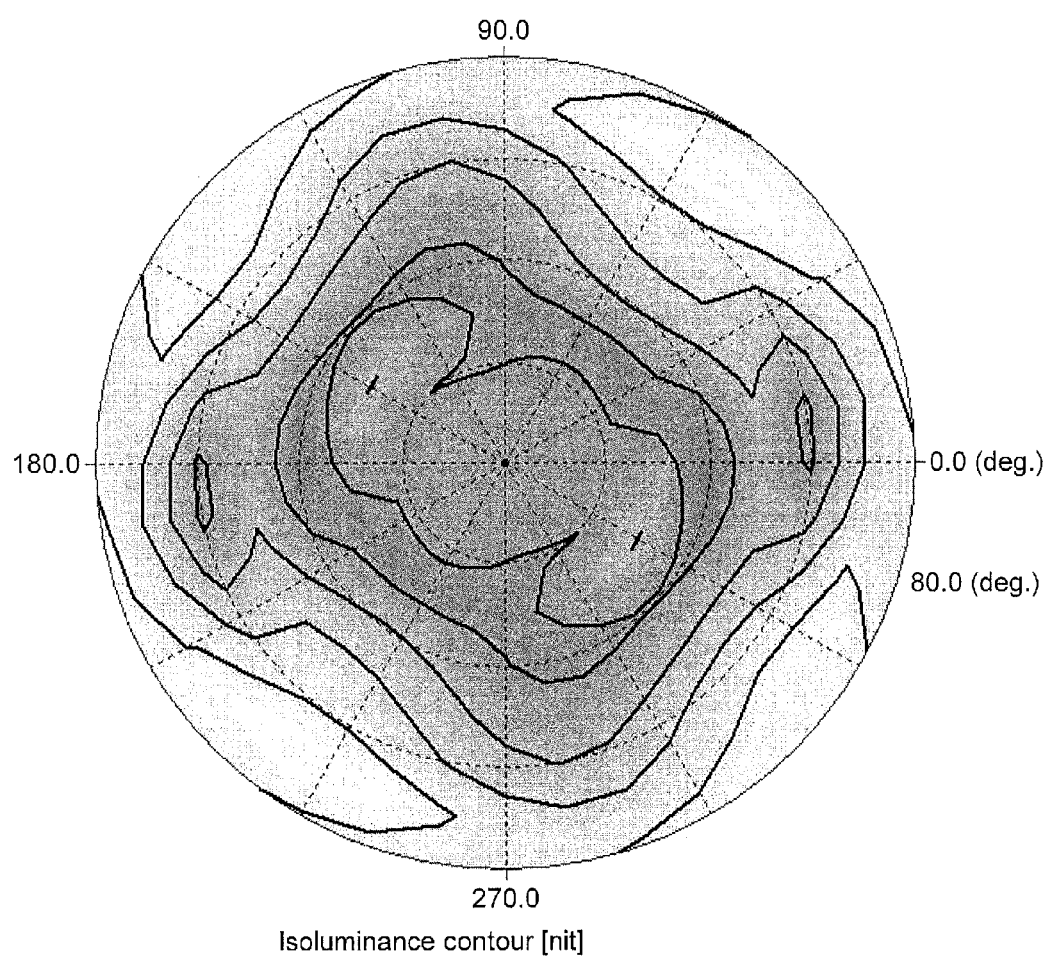
FIG. 5 is a contrast map of an organic EL display device obtained in Example 3.
Figure 6:
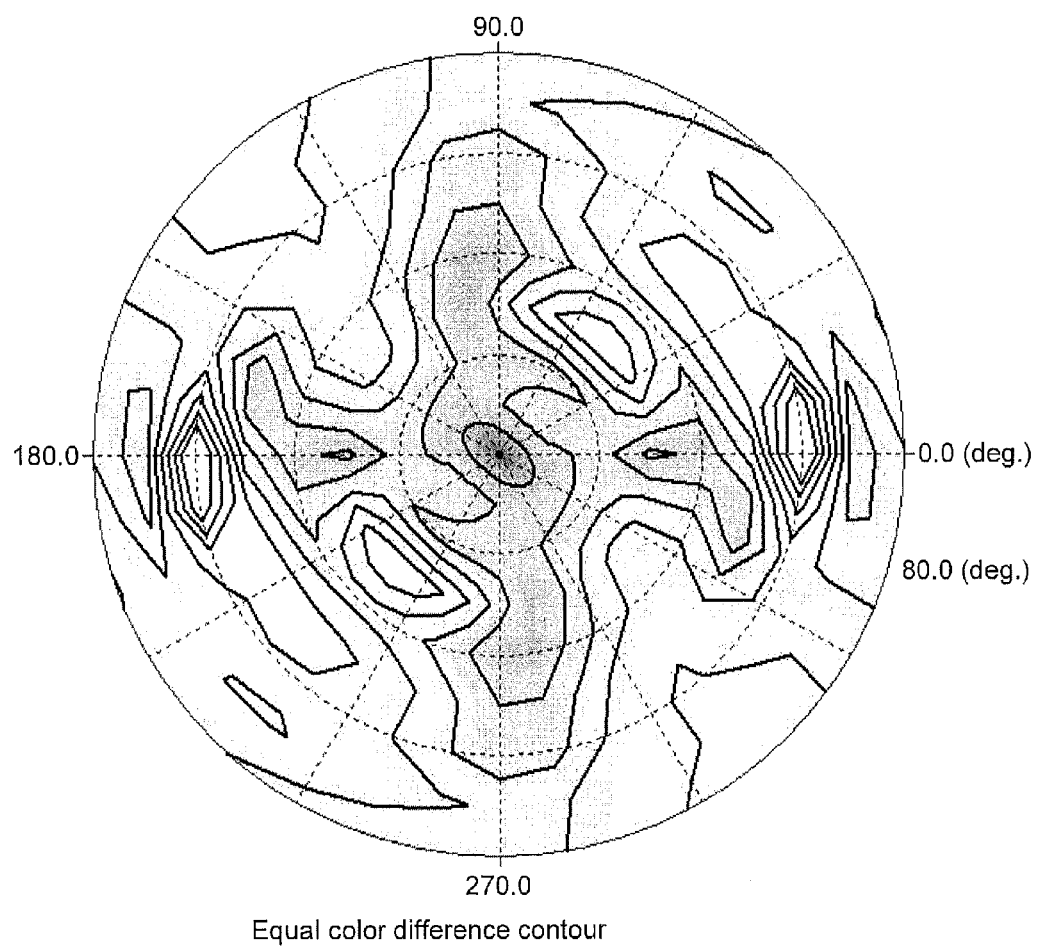
FIG. 6 is a color tone map of the organic EL display device obtained in Example 3.

Separately from this operation, a rectangular shape piece was cut out from the phase difference film C. A long-length polarizer was produced in the same manner as in Example 1 and therefrom a rectangular shape piece was cut out. The cut-out phase difference film C was laminated onto one surface of the cut-out polarizer with a roll laminator using an adhesive such that the angle between the slow axis of the phase difference film C and the stretching direction of the polarizer was 45° to thereby produce a circularly polarizing plate C. Using this circularly polarizing plate C, contrast and color tone were calculated, and viewing angle characteristics of an organic EL display device was evaluated. The results are shown in FIGS. 5 and 6 and Table 1.

Comparative Example 1

Pellets of transparent resin composition (A') were produced in the same manner as in Example 1 except that 57 parts of amorphous polystyrene ("HH102" manufactured by PS Japan Corporation, glass transition temperature: 101° C.) was used in place of 58 parts of syndiotactic polystyrene and that the amount of poly(2,6-dimetyl-1,4-phenylene oxide) was changed to 43 parts. The glass transition temperature of the resin composition (A') was 141° C. A pre-stretch film layered body of a three-layer structure having a P2 layer formed of the thermoplastic resin (B), a P1' layer formed of the resin composition (A'), and a P2 layer formed of the thermoplastic resin (B) in this order was obtained in the same manner as in Example 1 except that the pellets of the resin composition (A') were used in place of the pellets of the resin composition (A) (co-extrusion step). The ratio of the thicknesses of these layers was P2 layer:P1' layer: P2 layer=2:1:2.

Subsequently, this pre-stretch film layered body was diagonally stretched using a tenter stretching machine such that the slow axis was inclined at an angle of 45° with respect to the MD direction. The temperature during stretching was set to 143° C., which was a temperature higher than the glass transition temperature of the resin composition (A') by 2° C., and the stretching ratio was set to 3.0 times. A phase difference film layered body having a three-layer structure of (a p2 layer formed of the thermoplastic resin (B))/(a p1' layer formed of the resin composition (A'))/(a p2 layer formed of the thermoplastic resin (B)) was thereby obtained. The ratio of the thicknesses of these layers was p2 layer:p1' layer:p2 layer=2:1:2. Subsequently, the p2 layers on both sides were removed from the phase difference film layered body to obtain a long-length 99 μm-thick phase difference film D consisting only of the p1' layer. The obtained phase difference film D was wound to form a film roll. The orientation of the phase difference film D was checked, and the slow axis was found to be inclined at an angle of 45° with respect to the MD direction. The $Re_{550}$ of the phase difference film D was 138 nm. However the relation $Re_{450} < Re_{550} < Re_{650}$ was not satisfied. The Nz coefficient was +1.12.

Using the aforementioned phase difference film D, an attempt was made to produce a circularly polarizing plate in the same manner as in Example 1. However, rupture occurred in the phase difference film D several times during lamination from feeding from the roll.

Figure 7:
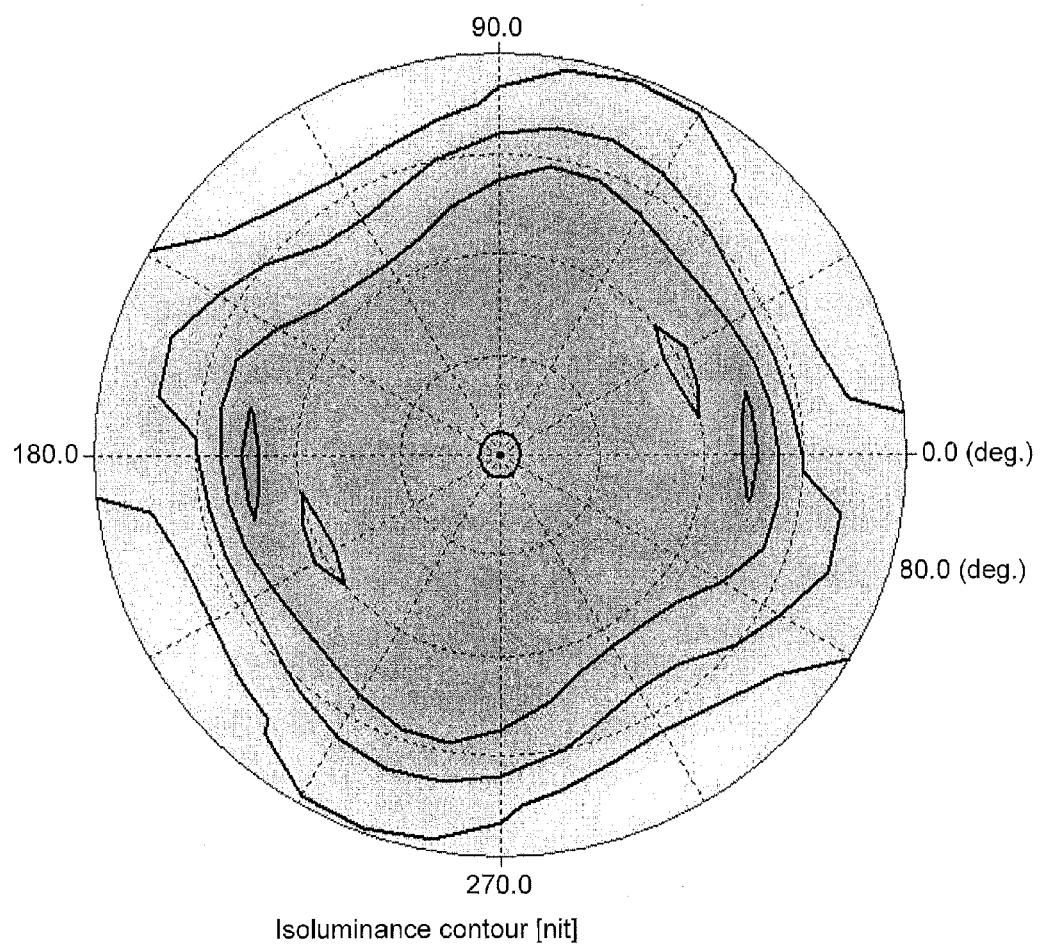
FIG. 7 is a contrast map of an organic EL display device obtained in Comparative Example 1.
Figure 8:
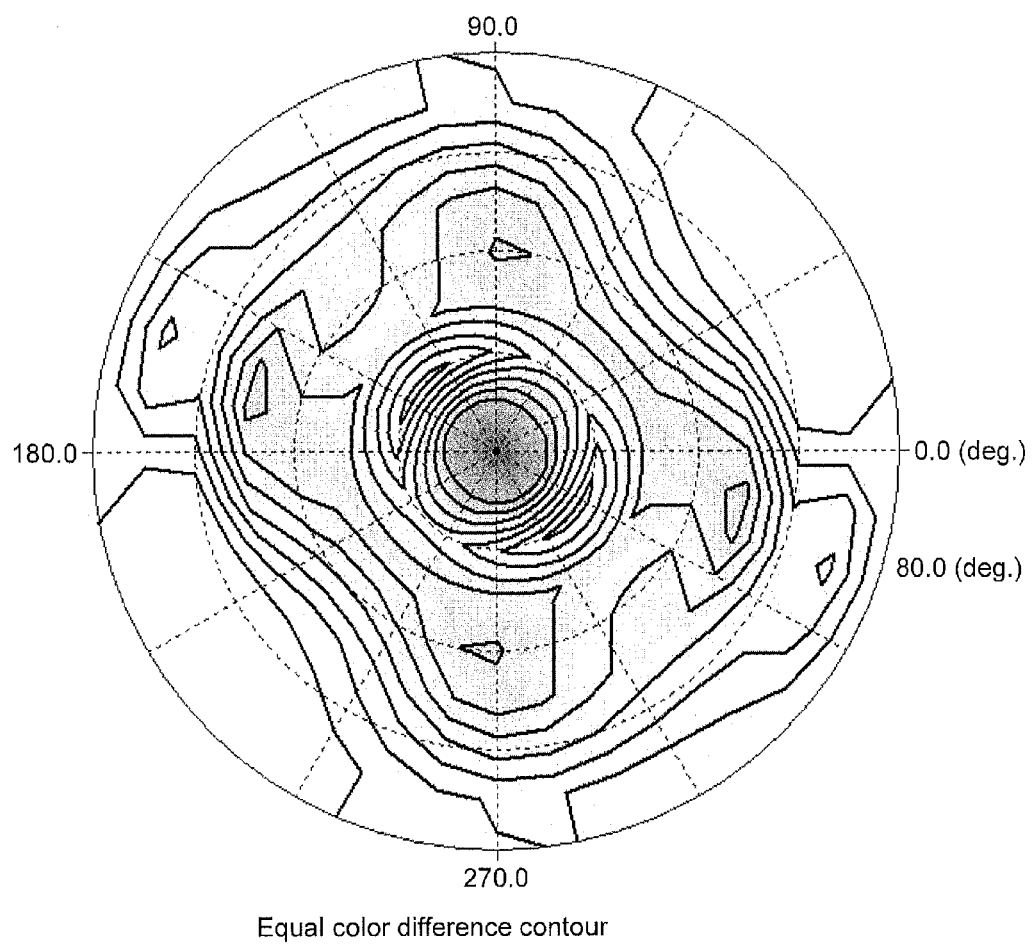
FIG. 8 is a color tone map of the organic EL display device obtained in Comparative Example 1.

Separately from this operation, a rectangular shape piece was cut out from the phase difference film D. A long-length polarizer was produced in the same manner as in Example 1 and therefrom a rectangular shape piece was cut out. The cut-out phase difference film D was laminated onto one surface of the cut-out polarizer with a roll laminator using an adhesive to thereby produce a circularly polarizing plate D. Using this circularly polarizing plate D, contrast and color tone was calculated, and viewing angle characteristics of an organic EL display device was evaluated. The results are shown in FIGS. 7 and 8 and Table 1.

Comparative Example 2

Pellets of transparent resin composition (A) were produced in the same manner as in Example 1 except that the amount of syndiotactic polystyrene was changed to 63 parts and that the amount of poly(2,6-dimetyl-1,4-phenylene oxide) was changed to 37 parts. The glass transition temperature of the resin composition (A) was 129° C. The pellets of the resin composition (A) were melted using a single screw extruder, and supplied to an extrusion die, to perform extrusion-molding, whereby a pre-stretch film was obtained. The obtained pre-stretch film was subjected to simultaneous biaxial stretching in the MD and TD directions using a tenter stretching machine. The temperature during stretching was set to 132° C., which was a temperature higher than the glass transition temperature of the resin composition (A) by 3° C. The stretching ratio was 1.3 times in the MD direction and 1.2 times in the TD direction. A long-length 62 μm-thick phase difference film E was thereby obtained. The obtained phase difference film E was wound to form a film roll. The orientation of the phase difference film E was checked, and the slow axis was found to be perpendicular the MD direction. The $Re_{550}$ of the phase difference film E was 142 nm. The phase difference film E satisfied the relation $Re_{450} < Re_{550} < Re_{650}$, and $Re_{450}/Re_{550}$ was 0.95. Δn was 0.0023, and the Nz coefficient was −1.00.

Using this phase difference film E, an attempt was made to produce a circularly polarizing plate in the same manner as in Example 1. During lamination from feeding from the roll, no rupture occurred in the phase difference film E, and the films were capable to be laminated over their entire length.

Figure 9:
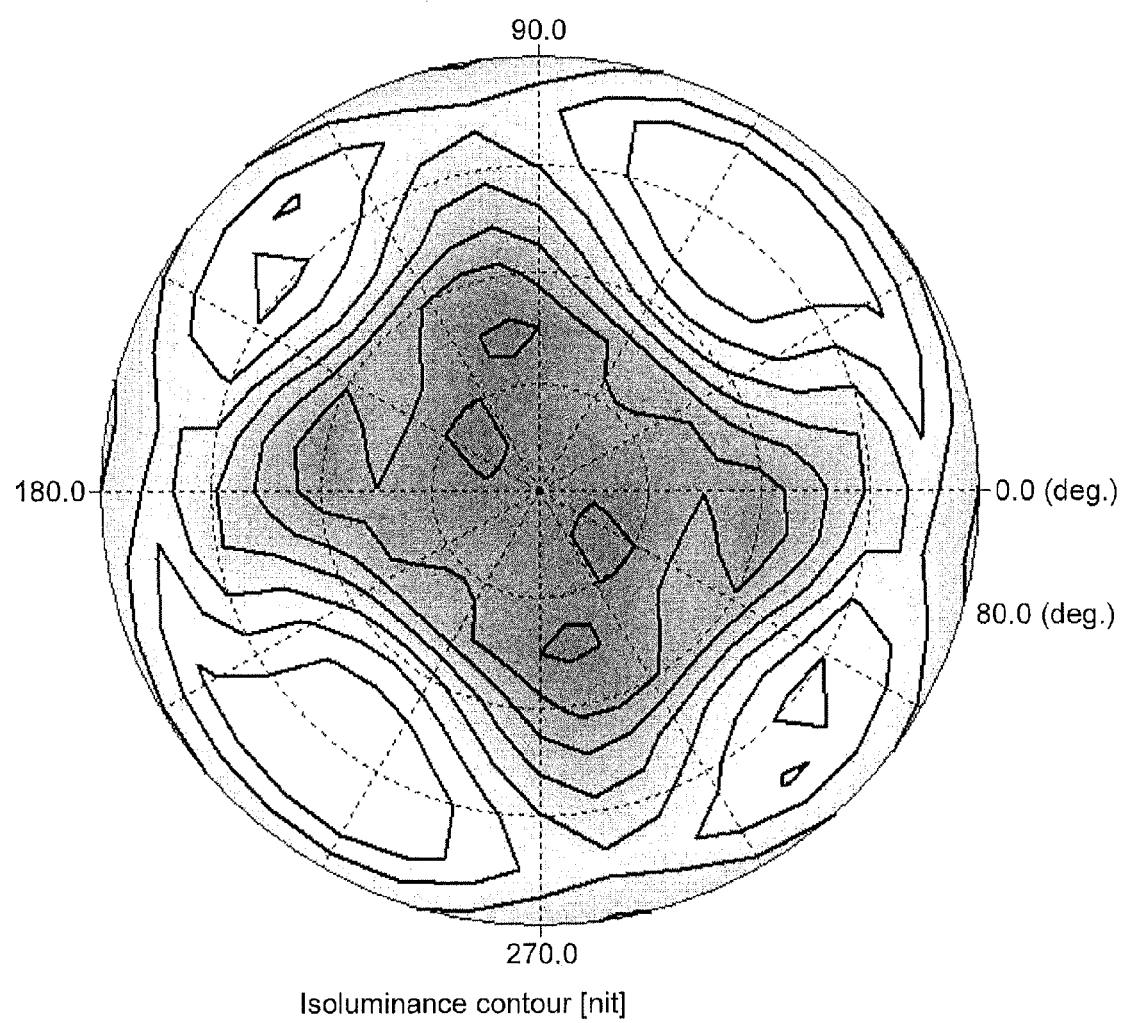
FIG. 9 is a contrast map of an organic EL display device obtained in Comparative Example 2.
Figure 10:
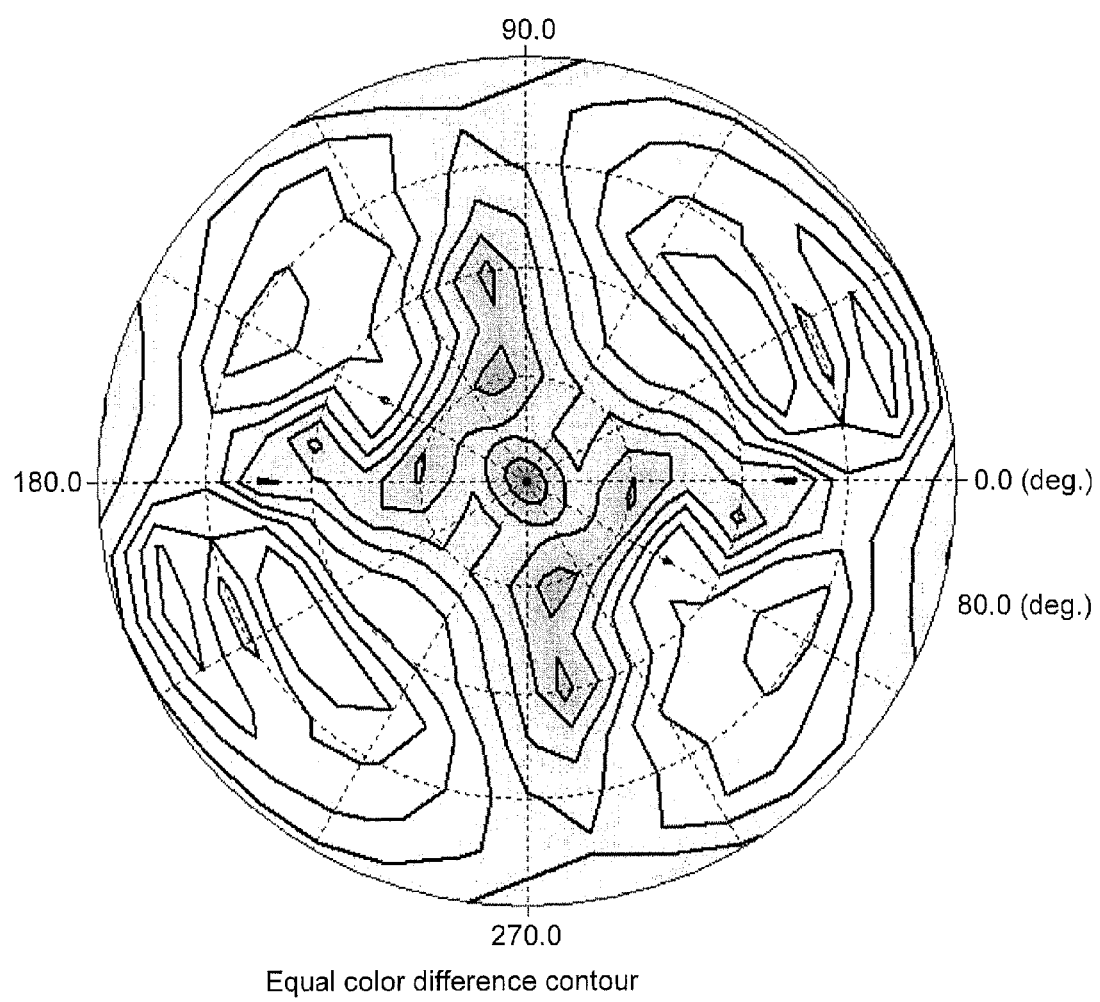
FIG. 10 is a color tone map of the organic EL display device obtained in Comparative Example 2.

Separately from this operation, a rectangular shape piece was cut out from the phase difference film E. A long-length polarizer was produced in the same manner as in Example 1 and therefrom a rectangular shape piece was cut out. The cut-out phase difference film E was laminated onto one surface of the cut-out polarizer with a roll laminator using an adhesive such that the angle between the slow axis of the phase difference film E and the stretching direction of the polarizer was 45° to thereby produce a circularly polarizing plate E. Using this circularly polarizing plate E, contrast and color tone were calculated, and viewing angle characteristics of an organic EL display device was evaluated. The results are shown in FIGS. 9 and 10 and Table 1.

Comparative Example 3

Pellets of transparent resin composition (A) were produced in the same manner as in Example 1 except that the amount of syndiotactic polystyrene was changed to 76 parts and the amount of poly(2,6-dimetyl-1,4-phenylene oxide) was changed to 24 parts. The glass transition temperature of the resin composition (A) was 115° C. The pellets of the resin composition (A) were melted using a single screw extruder, and supplied to an extrusion die, to perform extrusion-molding, whereby a pre-stretch film having a thickness of 100 μm was obtained.

Subsequently, an attempt was made to diagonally stretch the pre-stretch film using a tenter stretching machine in a direction inclined at an angle of 45° with respect to the MD direction. The temperature during stretching was set to 103° C., which was a temperature lower than the glass transition temperature of the resin composition (A) by 12° C. However, the film was ruptured when the stretching ratio reached 1.5 times, so that a phase difference film could not be obtained.

Comparative Example 4

A cellulose ester film (product name "KA" manufactured by Kaneka Corporation) was diagonally stretched to obtain a long-length 100 μm-thick phase difference film F. The obtained phase difference film F was wound to form a film roll. The orientation of the phase difference film F was checked, and the slow axis was found to be inclined at an angle of 45° with respect to the MD direction. The $Re_{550}$ of the phase difference film F was 140 nm. The phase difference film F satisfied the relation $Re_{450} < Re_{550} < Re_{650}$, and the Nz coefficient was +1.13.

Figure 11:
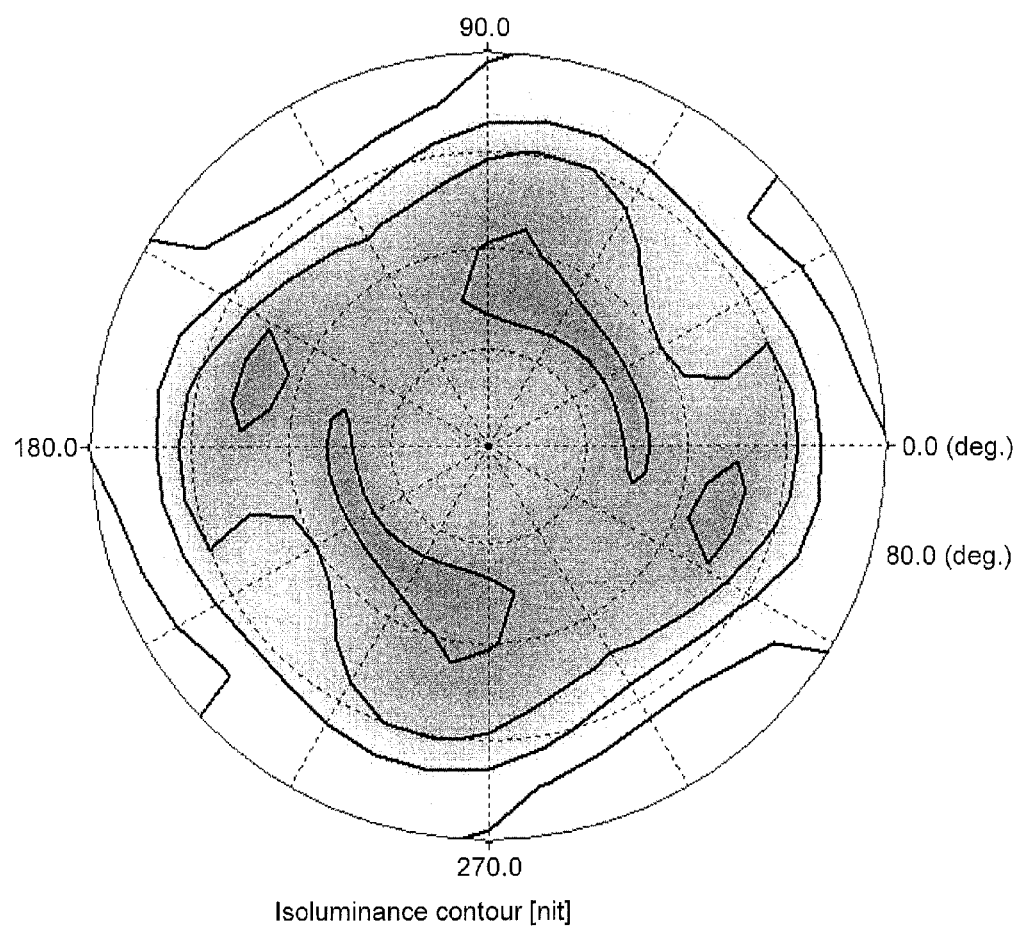
FIG. 11 is a contrast map of an organic EL display device obtained in Comparative Example 4.
Figure 12:
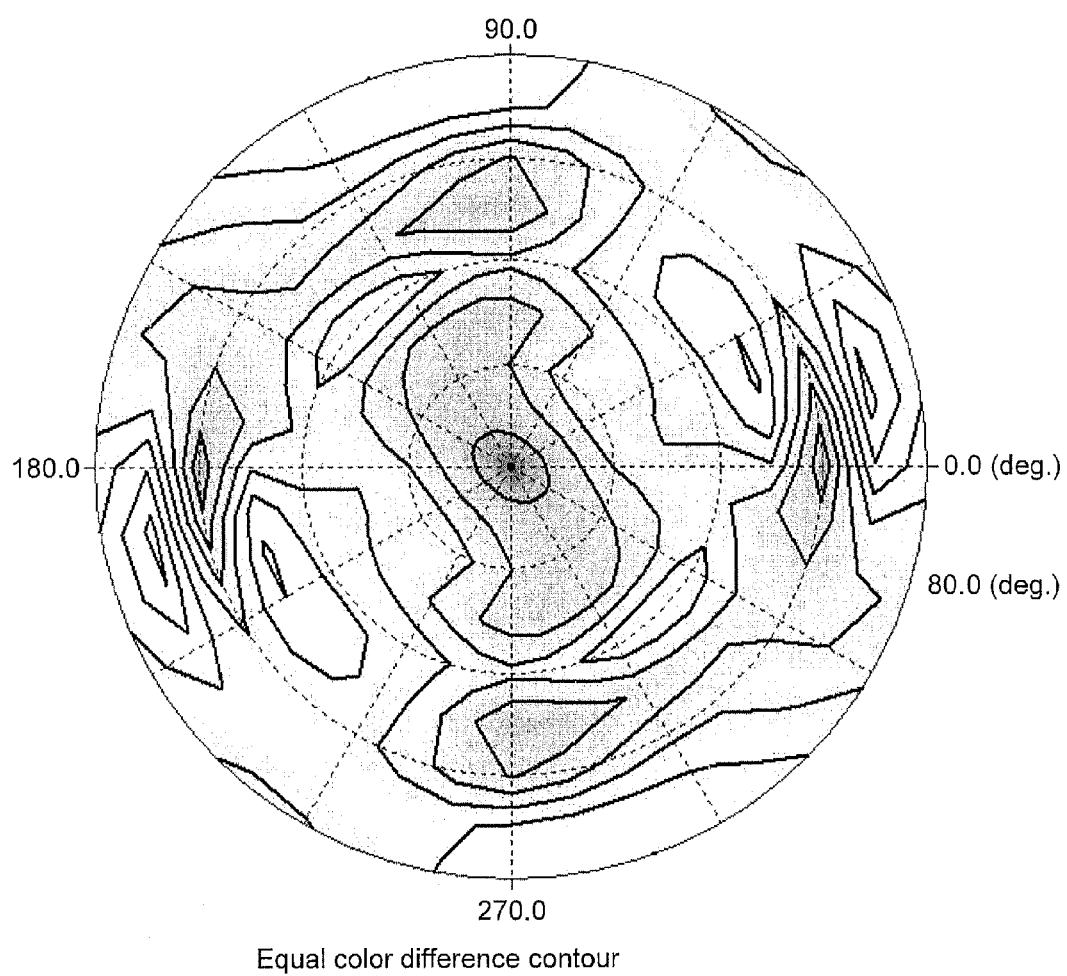
FIG. 12 is a color tone map of the organic EL display device obtained in Comparative Example 4.

A circularly polarizing plate F was produced using this phase difference film F in the same manner as in Example 1. During lamination from feeding from the roll, no rupture occurred in the phase difference film F, and the films were capable to be laminated over their entire length. Using the obtained circularly polarizing plate F, contrast and color tone were calculated, and viewing angle characteristics of an organic EL display device was evaluated. The results are shown in FIGS. 11 and 12 and Table 1.

TABLE 1

|  |  | Ex. 1 | Ex. 2 | Ex. 3 | Comp. Ex. 1 | Comp. Ex. 2 | Comp. Ex. 3 | Comp. Ex. 4 |
|---|---|---|---|---|---|---|---|---|
| Phase difference film |  | A | B | C | D | E | — | F |
| Resin composition | Syndiotactic polystyrene | 58 | 57 | 64 | — | 63 | 76 | — |

TABLE 1-continued

|  |  | Ex. 1 | Ex. 2 | Ex. 3 | Comp. Ex. 1 | Comp. Ex. 2 | Comp. Ex. 3 | Comp. Ex. 4 |
|---|---|---|---|---|---|---|---|---|
| (parts) | Amorphous polystyrene | — | — | — | 57 | — | — | — |
|  | Polyarylene ether | 42 | 43 | 36 | 43 | 37 | 24 | — |
|  | Cellulose ester | — | — | — | — | — | — | 100 |
| Manner of stretching (stretching ratio) |  | Diagonal (3.2) | Diagonal (2.8) | Longitudunal (1.4) + diagonal (1.6) sequential | Diagonal (2.5) | Longitudianl (1.3) + diagonal (1.2) simultaneous | Diagonal (1.5) | Diagonal |
| Stretching temperature (° C.) |  | Tg − 3 | Tg − 12 | Tg + 2 | Tg + 2 | Tg + 3 | Tg − 12 | — |
| Film thickness (μm) |  | 49 | 35 | 99 | 99 | 62 | Phase difference film not obtainable | — |
| Re$_{550}$ |  | 138 | 141 | 139 | 138 | 142 |  | 138 |
| Re$_{450}$ < Re$_{550}$ < Re$_{650}$ |  | OK | OK | OK | NG | OK |  | OK |
| Re$_{450}$/Re$_{550}$ |  | 0.87 | 0.88 | 0.96 | — | 0.95 |  | — |
| Birefringence Δn |  | 0.0028 | 0.0040 | 0.0014 | — | 0.0023 |  | — |
| Nz coefficient |  | −0.12 | −0.14 | −0.22 | +1.12 | −1.00 |  | +1.12 |
| Strength (flexibility) |  | A | A | B | B | A |  | A |
| Viewing angle characteristics |  | A | A | B | D | D |  | D |

As is clear from the aforementioned Examples and Comparative Examples, the organic EL devices of the present invention have high contrast, small color shifts, and good viewing angle characteristics. However, the organic EL devices in the Comparative Examples have low contrast, large color shifts, and poor viewing angle characteristics.

The invention claimed is:

1. A phase difference film, comprising:
a layer formed of a resin composition (A) containing a polystyrene-based polymer having a syndiotactic structure and polyarylene ether,
wherein:
a ratio of the polystyrene-based polymer having the syndiotactic structure with respect to the polyarylene ether in the resin composition (A) is 65:35 to 55:45, the ratio being a weight ratio of (the polystyrene-based polymer having the syndiotactic structure) with respect to (the polyarylene ether),
the phase difference film satisfies a relation Re$_{450}$<Re$_{550}$<Re$_{650}$, and
Re$_{450}$, Re$_{550}$, and Re$_{650}$ are in-plane direction retardations of the phase difference film at measurement wavelengths of 450 nm, 550 nm, and 650 nm, respectively.

2. The phase difference film according to claim 1, wherein Re$_{450}$/Re$_{550}$ in the phase difference film is 0.80 or more and 0.90 or less.

3. The phase difference film according to claim 1, wherein a birefringence Δn (Δn=nx−ny) of the phase difference film at a wavelength of 550 nm is 0.0020 or more and 0.0050 or less.

4. The phase difference film according to claim 1, having a thickness of 80 μm or less.

5. The phase difference film according to claim 1, wherein the polyarylene ether contains a polymer including a phenylene ether unit.

6. The phase difference film according to claim 1, wherein the in-plane direction retardation Re$_{550}$ of the phase difference film at a measurement wavelength of 550 nm is 110 nm to 150 nm.

7. The phase difference film according to claim 1, wherein the phase difference film is prepared by subjecting a long-length pre-stretch film formed of the resin composition (A) to stretching in a direction within a range of 40° or more and 50° or less with respect to a lengthwise direction of the long-length pre-stretch film.

8. The phase difference film according to claim 7, wherein the stretching is performed at a temperature equal to or higher than (Tg−15)° C. and equal to or lower than (Tg+1)° C., wherein (Tg) is the glass transition temperature of the resin composition (A).

9. The phase difference film according to claim 1, wherein the phase difference film is prepared by subjecting a long-length pre-stretch film layered body to stretching in a direction within a range of 40° or more and 50° or less with respect to a lengthwise direction of the long-length pre-stretch film layered body, the pre-stretch film layered body including a P1 layer formed of the resin composition (A) and a P2 layer provided in contact with the P1 layer and formed of a thermoplastic resin (B).

10. The phase difference film according to claim 9 wherein the thermoplastic resin (B) is at least one selected from acrylic resins, resins containing alicyclic structure-containing polymers, and polycarbonate resins.

11. The phase difference film according to claim 10, wherein the long-length pre-stretch film layered body is obtained by co-extrusion or co-flow casting of the resin composition (A) and the thermoplastic resin (B).

12. The phase difference film according to claim 9, wherein the long-length pre-stretch film layered body is obtained by co-extrusion or co-flow casting of the resin composition (A) and the thermoplastic resin (B).

13. The phase difference film according to claim 9, wherein the stretching is performed at a temperature equal to or higher than (Tg−15)° C. and equal to or lower than (Tg+1)° C., wherein (Tg) is the glass transition temperature of the resin composition (A).

14. The phase difference film according to claim 1, wherein the phase difference film is prepared by: subjecting a long-length pre-stretch film layered body to stretching in a direction within a range of 40° or more and 50° or less with respect to a lengthwise direction of the long-length pre-stretch film layered body, the pre-stretch film layered body including a P1 layer formed of the resin composition (A) and a P2 layer provided in contact with the P1 layer and formed of a thermoplastic resin (B), whereby a phase difference film layered body including a p1 layer formed by stretching the P1 layer and a p2 layer formed by stretching the P2 layer is obtained; and then removing the p2 layer.

15. The phase difference film according to claim 14, wherein the thermoplastic resin (B) is at least one selected from acrylic resins, resins containing alicyclic structure-containing polymers, and polycarbonate resins.

16. The phase difference film according to claim 14, wherein the long-length pre-stretch film layered body is obtained by co-extrusion or co-flow casting of the resin composition (A) and the thermoplastic resin (B).

17. The phase difference film according to claim 14, wherein the stretching is performed at a temperature equal to or higher than (Tg−15)° C. and equal to or lower than (Tg+1)° C., wherein (Tg) is the glass transition temperature of the resin composition (A).

18. The phase difference film according to claim 1, wherein:
- an Nz coefficient of the phase difference film at a wavelength of 550 nm is −0.25 to −0.05,
- the Nz coefficient represents (nx−nz)/(nx−ny),
- nx represents a refractive index in a direction of an in-plane slow axis of the phase difference film,
- ny represents a refractive index in a direction of an in-plane fast axis of the phase difference film, and
- nz represents a refractive index in a thickness direction of the phase difference film.

\* \* \* \* \*